US011404002B2

(12) United States Patent
Song et al.

(10) Patent No.: US 11,404,002 B2
(45) Date of Patent: Aug. 2, 2022

(54) PIXEL UNIT, COMPENSATION METHOD OF PIXEL UNIT, DISPLAY DEVICE AND MANUFACTURING METHOD OF DISPLAY DEVICE

(71) Applicant: BOE Technology Group Co., Ltd., Beijing (CN)

(72) Inventors: Zhen Song, Beijing (CN); Guoying Wang, Beijing (CN)

(73) Assignee: BOE Technology Group Co., LTD., Beijing (CN)

( * ) Notice: Subject to any disclaimer, the term of this patent is extended or adjusted under 35 U.S.C. 154(b) by 247 days.

(21) Appl. No.: 16/609,246

(22) PCT Filed: Feb. 28, 2019

(86) PCT No.: PCT/CN2019/076428
§ 371 (c)(1),
(2) Date: Oct. 29, 2019

(87) PCT Pub. No.: WO2020/001049
PCT Pub. Date: Jan. 2, 2020

(65) Prior Publication Data
US 2021/0335238 A1 Oct. 28, 2021

(30) Foreign Application Priority Data
Jun. 29, 2018 (CN) .......................... 201810712972.1

(51) Int. Cl.
*G09G 3/3233* (2016.01)
*H01L 27/32* (2006.01)
*H01L 51/56* (2006.01)

(52) U.S. Cl.
CPC ......... *G09G 3/3233* (2013.01); *H01L 27/322* (2013.01); *H01L 27/3227* (2013.01);
(Continued)

(58) Field of Classification Search
CPC .. G09G 3/3233; G09G 3/3291; G09G 3/3258; G09G 3/006; G09G 2300/0842;
(Continued)

(56) References Cited

U.S. PATENT DOCUMENTS

2001/0028060 A1  10/2001 Yamazaki et al.
2008/0036703 A1   2/2008 Wang et al.
(Continued)

FOREIGN PATENT DOCUMENTS

CN      1571605 A    1/2005
CN    101123066 A    2/2008
(Continued)

OTHER PUBLICATIONS

International search report of PCT application No. PCT/CN2019/076428 dated May 29, 2019.
(Continued)

*Primary Examiner* — Dong Hui Liang
(74) *Attorney, Agent, or Firm* — Fay Sharpe LLP

(57) ABSTRACT

A pixel unit, a compensation method of the pixel unit, a display device and a manufacturing method of the display device are disclosed. The pixel unit includes a light-emitting circuit configured to emit light under control of an external control circuit, a photosensitive element configured to sense a light intensity of light emitted by the light-emitting circuit and to output a sensed light intensity signal by a sensing output terminal, and a switch circuit configured to control an ON/OFF state between the sensing output terminal and the external control circuit.

18 Claims, 18 Drawing Sheets

(52) U.S. Cl.
CPC .......... *H01L 27/3246* (2013.01); *H01L 51/56* (2013.01); *G09G 2360/14* (2013.01); *H01L 2227/323* (2013.01)

(58) Field of Classification Search
CPC ... G09G 2300/0819; G09G 2300/0426; G09G 2300/043; G09G 2300/0866; G09G 2300/0809; G09G 2320/043; G09G 2320/0295; G09G 2320/045; G09G 2320/0233; G09G 2320/029; G09G 2310/027

See application file for complete search history.

(56) References Cited

U.S. PATENT DOCUMENTS

| | | | |
|---|---|---|---|
| 2010/0289829 A1 | 11/2010 | Yamamoto et al. | |
| 2011/0164010 A1 | 7/2011 | Yamamoto et al. | |
| 2012/0032193 A1* | 2/2012 | Kurokawa | H01L 27/14623 257/84 |
| 2015/0243217 A1 | 8/2015 | Park et al. | |
| 2017/0004764 A1 | 1/2017 | Kim et al. | |
| 2018/0005571 A1 | 1/2018 | Song | |
| 2019/0103059 A1 | 4/2019 | Yang et al. | |
| 2019/0164493 A1 | 5/2019 | Liu et al. | |
| 2019/0318684 A1* | 10/2019 | Gai | G09G 3/3225 |
| 2020/0044004 A1* | 2/2020 | Wang | H01L 27/3272 |
| 2020/0058253 A1* | 2/2020 | Lin | G09G 3/3233 |
| 2020/0175243 A1* | 6/2020 | Liu | G06K 9/0004 |
| 2020/0194528 A1* | 6/2020 | Song | H01L 27/3269 |
| 2020/0411608 A1* | 12/2020 | Tang | H01L 27/3227 |
| 2021/0056905 A1* | 2/2021 | Liu | H01L 51/524 |
| 2021/0066425 A1* | 3/2021 | Di | H01L 51/56 |
| 2021/0124897 A1* | 4/2021 | Liu | H01L 51/5253 |

FOREIGN PATENT DOCUMENTS

| | | |
|---|---|---|
| CN | 101887688 A | 11/2010 |
| CN | 102122486 A | 7/2011 |
| CN | 104157669 A | 11/2014 |
| CN | 104900186 A | 9/2015 |
| CN | 106328062 A | 1/2017 |
| CN | 106654071 A | 5/2017 |
| CN | 106875892 A | 6/2017 |
| CN | 107154424 A | 9/2017 |
| CN | 107346778 A | 11/2017 |
| CN | 107464529 A | 12/2017 |
| CN | 107610643 A | 1/2018 |
| CN | 107863065 A | 3/2018 |
| CN | 108877653 A | 11/2018 |
| EP | 1335430 A1 | 8/2003 |
| JP | 2008209939 A | 9/2008 |
| JP | 2009145446 A | 7/2009 |
| KR | 20090026907 A | 3/2009 |

OTHER PUBLICATIONS

First office action of Chinese application No. 201810712972.1 dated Sep. 29, 2019.

Second office action of Chinese application No. 201810712972.1 dated Apr. 21, 2020.

* cited by examiner

PIXEL UNIT, COMPENSATION METHOD OF PIXEL UNIT, DISPLAY DEVICE AND MANUFACTURING METHOD OF DISPLAY DEVICE

CROSS-REFERENCE TO RELATED APPLICATION

This application is a 371 of PCT Patent Application Serial No. PCT/CN2019/076428, filed on Feb. 28, 2019, which claims priority to Chinese Patent Application No. 201810712972.1, filed on Jun. 29, 2018 and entitled "PIXEL UNIT, COMPENSATION METHOD OF PIXEL UNIT, DISPLAY DEVICE AND MANUFACTURING METHOD OF DISPLAY DEVICE", the entire contents of which are incorporated herein by reference.

TECHNICAL FIELD

The present disclosure relates to a pixel unit and a compensation method thereof, and a display device and a manufacturing method thereof.

BACKGROUND

An organic light-emitting diode (OLED) display is a display mainly made of an organic electroluminescent diode, and has become one of the mainstream products at present by virtue of its advantages of high luminance, rich color, low driving voltage, fast response and low power consumption.

The OLED display includes a plurality of pixel units, each of which includes a driving transistor and a light-emitting element. The driving transistor is configured to output a light-emitting current to the light-emitting element to drive the light-emitting element to emit light. The magnitude of the light-emitting current is relevant to a threshold voltage of the driving transistor. The luminance uniformity of the OLED display will be adversely affected when the threshold voltages of the driving transistors in different pixel units drift to different degrees. In the related art, in order to guarantee the luminance uniformity of the OLED display, drifts of the threshold voltages of the driving transistors may be compensated by means of internal, external or internal and external hybrid electrical compensation.

SUMMARY

The present disclosure provides a pixel unit and a compensation method thereof, and a display device and a manufacturing method thereof. The technical solutions are as follows:

In one aspect, a pixel unit is provided. The pixel unit includes:

a light-emitting circuit, configured to emit light under control of light-emitting control data provided by an external control circuit;

a photosensitive element, wherein a sensing output terminal of the photosensitive element is connected to the switch circuit, and the photosensitive element is configured to sense a light intensity of the light emitted by the light-emitting circuit and to output a sensed light intensity signal by the sensing output terminal; and a switch circuit, configured to be connected to the external control circuit and to control an ON/OFF state between the sensing output terminal and the external control circuit based on a received switch control signal, wherein the external control circuit is configured to adjust the light-emitting control data based on the sensed light intensity signal;

wherein the photosensitive element includes a first electrode, a photosensitive material layer and a second electrode which are sequentially stacked in a direction distal from a light-emitting element in the light-emitting circuit; and wherein the first electrode is made from a transparent conductive material and is connected to a bias signal terminal that is configured to provide a bias voltage, and the second electrode is made from a light-shielding material and is connected to the switch circuit as the sensing output terminal of the photosensitive element.

In a possible implementation, the switch circuit is connected to the external control circuit by a sensing signal line; and the second electrode and the sensing signal line are both disposed in a source/drain conductive layer where a source and a drain of a transistor included in the switch circuit are disposed.

In a possible implementation, the first electrode is connected to the bias signal terminal by a bias voltage line, and the bias voltage line and the sensing signal line for connecting the switch circuit to the external control circuit are disposed on the same layer and extend in the same direction.

In a possible implementation, the switch circuit includes a first transistor;

wherein a gate of the first transistor is configured to be connected to a switch signal terminal, one of a source and a drain of the first transistor is configured to be connected to the external control circuit, the other thereof is connected to the sensing output terminal, and the switch signal terminal is configured to provide the switch control signal.

In a possible implementation, the light-emitting circuit includes a light-emitting element and a light-emitting driving sub-circuit, wherein a light-emitting current output terminal of the light-emitting driving sub-circuit is connected to one electrode of the light-emitting element; and the switch circuit is further connected to the light-emitting current output terminal and further configured to: control an ON/OFF state between the light-emitting current output terminal and the external control circuit based on the received switch control signal, such that the external control circuit adjusts luminance of the light-emitting element based on data output by the light-emitting current output terminal.

In a possible implementation, the switch control signal includes a first switch signal and a second switch signal;

wherein the switch circuit is configured to control the ON/OFF state between the sensing output terminal and the external control circuit based on the first switch signal and to control the ON/OFF state between the light-emitting current output terminal and the external control circuit based on the second switch signal.

In a possible implementation, the switch circuit includes a first transistor and a second transistor; wherein a gate of the first transistor is configured to be connected to a first switch signal terminal, one of a source and a drain of the first transistor is configured to be connected to the external control circuit, and the other thereof is connected to the light-emitting current output terminal; and a gate of the second transistor is configured to be connected to a second switch signal terminal, one of a source and a drain of the second transistor is configured to be connected to the external control circuit, and the other thereof is connected to the sensing output terminal, and the first switch signal terminal is configured to provide the first switch signal, and the second switch signal terminal is configured to provide the second switch signal.

In a possible implementation, the switch circuit includes a first transistor and a second transistor which are respectively one of an N-type transistor and a P-type transistor; wherein a gate of the first transistor is configured to be connected to a switch signal terminal, one of a source and a drain of the first transistor is configured to be connected to the external control circuit, and the other thereof is connected to the sensing output terminal; and a gate of the second transistor is configured to be connected to the switch signal terminal, one of a source and a drain of the second transistor is configured to be connected to the external control circuit, and the other thereof is connected to the light-emitting current output terminal; wherein the switch signal terminal is configured to provide the switch control signal.

In a possible implementation, a gate of a transistor included in the switch circuit is connected to a switch signal terminal by a switch signal line, and the switch signal line is in a gate conductive layer where the gate of the transistor included in the switch circuit is disposed.

In a possible implementation, the light-emitting driving sub-circuit includes a third transistor, a storage capacitor and a driving transistor; wherein a gate of the third transistor is connected to a gate line, one of a source and a drain of the third transistor is connected to a data line, and the other thereof is connected to a gate of the driving transistor;

one of a source and a drain of the driving transistor is connected to the light-emitting current output terminal, and the other thereof is connected to a light-emitting power supply terminal; and a first terminal of the storage capacitor is connected to the gate of the driving transistor, and a second terminal of the storage capacitor is connected to the light-emitting power supply terminal.

In a possible implementation, the pixel unit further includes a color filter layer disposed on one side of a light-emitting element in the light-emitting circuit, and the photosensitive element is disposed on the side, distal from the light-emitting element, of the color filter layer.

In a possible implementation, the pixel unit further includes a pixel defining layer made from a light-shielding material, wherein the pixel unit is provided with a first region where the pixel defining layer is disposed and a second region surrounded by the first region;

wherein the switch circuit is in the first region; a light-emitting element in the light-emitting circuit is in the second region; and the photosensitive element is disposed at an edge, proximal to the switch circuit, in the second region.

In a possible implementation, a light-emitting driving sub-circuit in the light-emitting circuit is in the first region and disposed on the side, distal from the second region, of the switch circuit.

In a possible implementation, the photosensitive material layer includes a P-type semiconductor material layer, an I-type semiconductor material layer and an N-type semiconductor material layer which are sequentially stacked in the direction distal from the light-emitting element in the light-emitting circuit.

In another aspect, a compensation method of a pixel unit is provided, applied to an external control circuit, wherein the pixel unit is the pixel unit in the above aspect, and the compensation method includes:

receiving a sensed light intensity signal sent by a switch circuit in the pixel unit, wherein the sensed light intensity signal is obtained by sensing, by a photosensitive element in the pixel unit, a light intensity of light emitted by a light-emitting circuit of the pixel unit;

determining a target compensation quantity of light-emitting control data based on the sensed light intensity signal;

compensating for the light-emitting control data of the pixel unit based on the target compensation quantity; and driving, based on the compensated light-emitting control data, the light-emitting circuit of the pixel unit to emit light.

In a possible implementation, the determining a target compensation quantity of light-emitting control data based on the sensed light intensity signal includes:

determining, based on the sensed light intensity signal an actual light intensity of the light emitted by the light-emitting circuit;

acquiring actual light-emitting control data for driving the light-emitting circuit when the switch circuit senses the light emitted by the light-emitting circuit; and determining, based on a corresponding relationship among light intensity, light-emitting control data and compensation quantity, the target compensation quantity that corresponds to the actual light intensity and the actual light-emitting control data.

In still another aspect, a display device is provided. The display device includes at least one pixel unit in the above aspect.

In a possible implementation, the display device further includes an external control circuit connected to a light-emitting circuit and a switch circuit in the pixel unit.

In yet still another aspect, a manufacturing method of a display device is provided, wherein the display device is the display device in the above aspect, and the method includes:

forming a transistor device layer on a base substrate, wherein the transistor device layer includes a switch circuit of each pixel unit and a light-emitting driving sub-circuit in a light-emitting circuit;

forming a photosensitive element of each pixel unit, wherein a sensing output terminal of the photosensitive element is connected to the switch circuit in the transistor device layer; and forming a light-emitting element in the light-emitting circuit of each pixel unit, wherein one electrode of the light-emitting element is connected to a light-emitting current output terminal of the light-emitting driving sub-circuit.

BRIEF DESCRIPTION OF THE DRAWINGS

For clearer descriptions of the technical solutions in the embodiments of the present disclosure, the following briefly introduces the accompanying drawings required for describing the embodiments. Apparently, the accompanying drawings in the following description show merely some embodiments of the present disclosure, and reasonable variations to the accompanying drawings shall fall within the protection scope of the present disclosure.

DETAILED DESCRIPTION

For clearer descriptions of the objectives, the technical solutions and advantages of the present disclosure, the embodiments of the present disclosure will be described below in detail in conjunction with the accompanying drawings. It is obvious that the described embodiments are part rather than all of the embodiments of the present disclosure. All other embodiments obtained by those of ordinary skill in the art based on the embodiments of the present disclosure without creative work are within the scope of protection of the present disclosure. Unless otherwise defined, technical terms or scientific terms used in the present disclosure shall be of ordinary meaning as understood by those of ordinary skill in the art to which the present disclosure pertains. The term "first" or "second" or a similar term used in the present disclosure does not denote any order, quantity, or importance, but is merely used to distinguish different components. The term "comprising", "including" or a similar term means that elements or items which appear before the term include the elements or items listed after the term and their equivalents, and do not exclude other elements or items. The term "connection" or "connected to" or a similar term is not limited to a physical or mechanical connection but may include an electrical connection that is direct or indirect.

Figure 1:
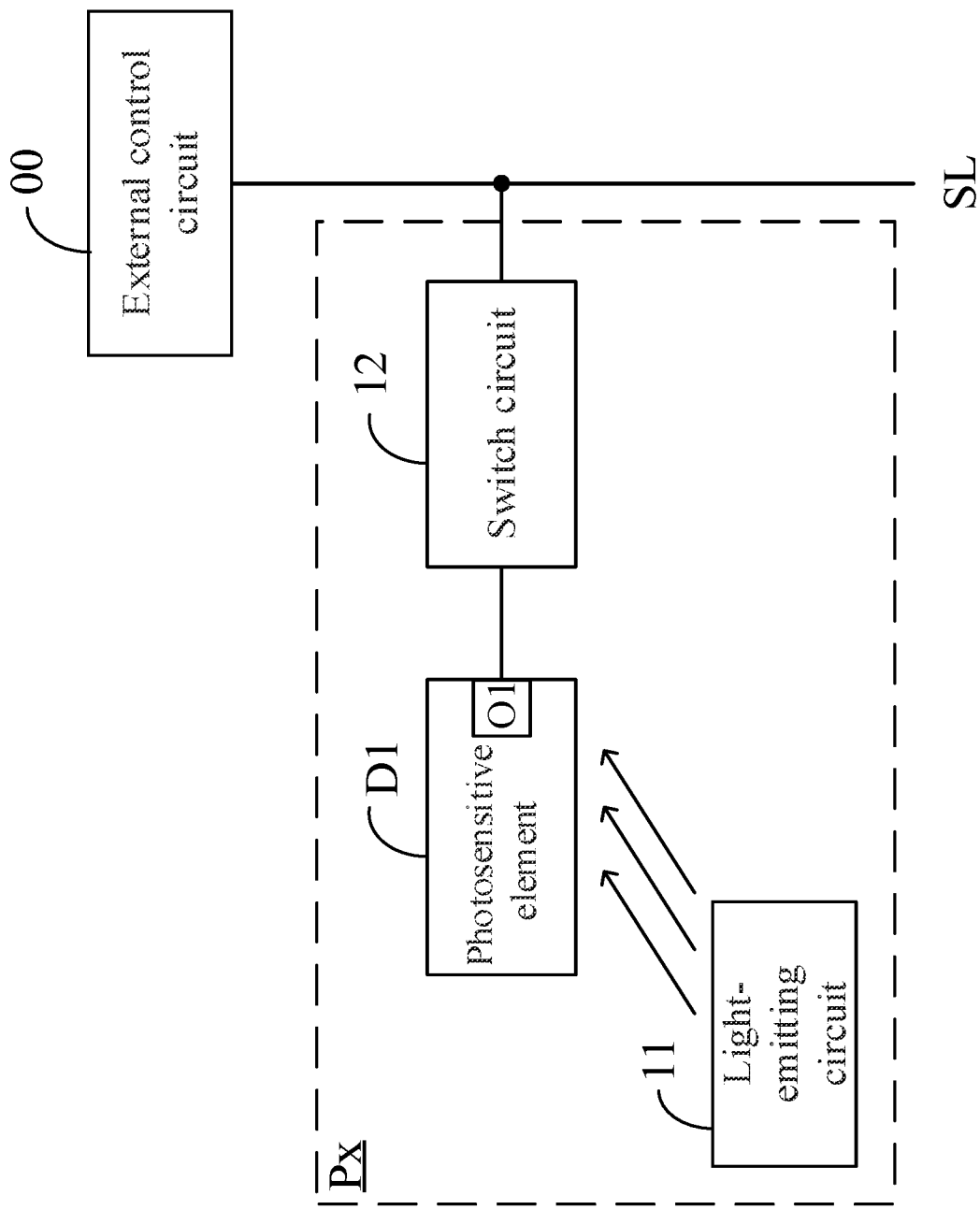
FIG. 1 is a structural block diagram of a pixel unit in accordance with one embodiment of the present disclosure.

FIG. 1 is a structural block diagram of a pixel unit in accordance with an embodiment of the present disclosure. Referring to FIG. 1, the pixel unit Px may include a light-emitting circuit 11, a photosensitive element D1 and a switch circuit 12.

The light-emitting circuit 11 is configured to emit light under control of light-emitting control data provided by an external control circuit 00.

The photosensitive element D1 is configured to receive light emitted by the light-emitting circuit 11, to sense a light intensity of the light emitted by the light-emitting circuit 11, and to output a sensed light intensity signal by a sensing output terminal O1 of the photosensitive element D1.

The switch circuit 12 is connected to the sensing output terminal O1 of the photosensitive element D1 and is configured to be connected to the external control circuit 00 and to control an ON/OFF state between the sensing output terminal O1 and the external control circuit 00 based on a received switch control signal, wherein the external control circuit 00 is configured to adjust the light-emitting control data based on the sensed light intensity signal.

By example, as shown in FIG. 1, the switch circuit 12 of the pixel unit Px may be connected to a sensing signal line SL and be connected to the external control circuit 00 by the sensing signal line SL. The switch circuit 12 may control an ON/OFF state between the sensing output terminal O1 and the sensing signal line SL. The external control circuit 00 may also be connected to the light-emitting circuit 11 (not shown in FIG. 1) and may adjust light-emitting control data input into the light-emitting circuit 11 so as to adjust the luminance of the light-emitting circuit 11.

Based on the structure of the pixel unit according to the present disclosure, the external control circuit 00 may acquire the sensed light intensity signal relevant to a change of self-illuminating efficiency of the light-emitting circuit. Based on this, compensation for the change of the self-illuminating efficiency of the light-emitting circuit may be realized with reference to external calculation and adjustment of a data signal, which helps to improve the luminance uniformity and to prolong the service life of a self-luminous display device.

Figure 2:
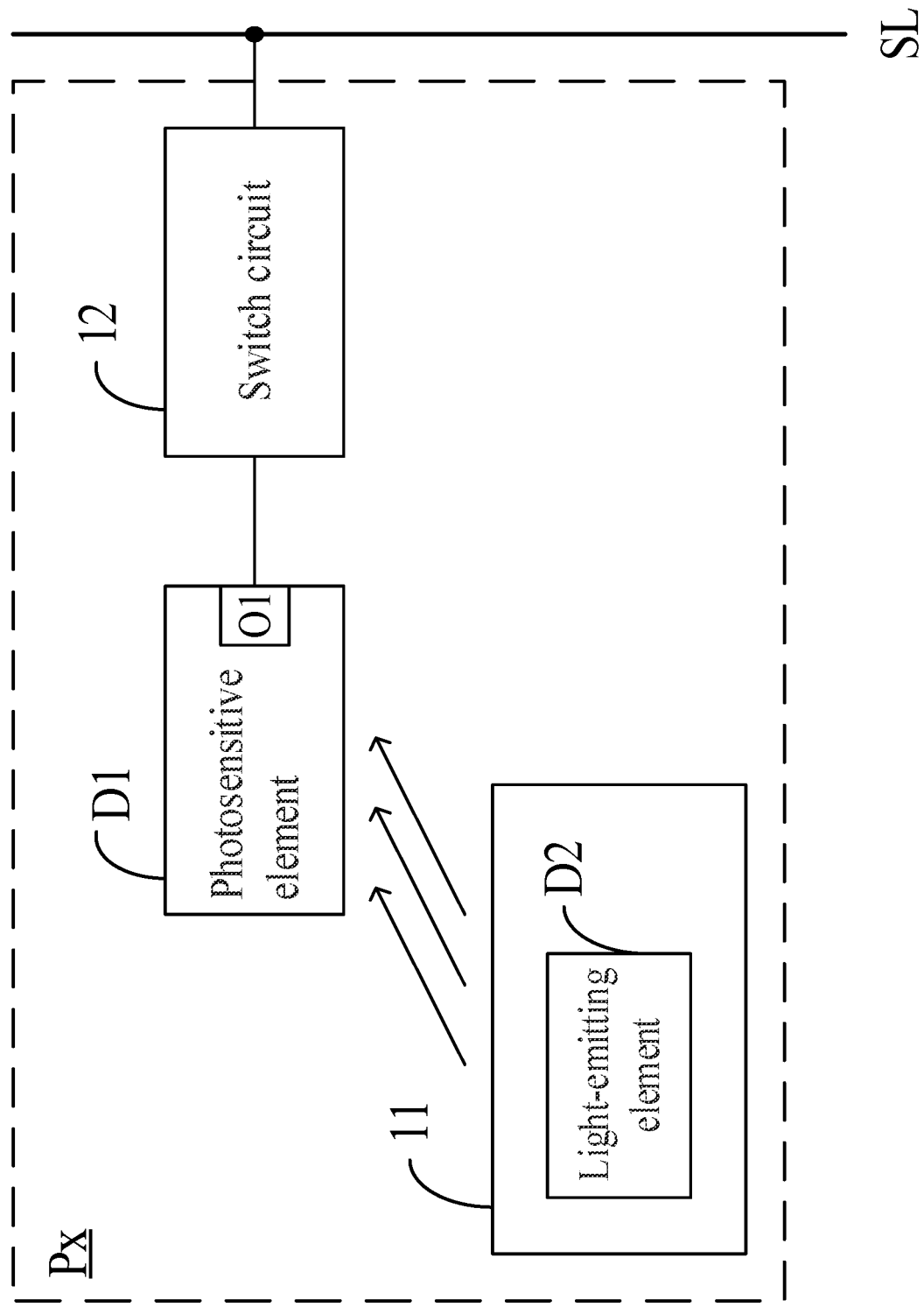
FIG. 2 is a structural block diagram of a pixel unit in accordance with another embodiment of the present disclosure.

FIG. 2 is a structural block diagram of a pixel unit in accordance with another embodiment of the present disclosure. Referring to FIG. 2, the light-emitting circuit 11 may include a light-emitting element D2. The photosensitive element D1 may be configured to receive light emitted by the light-emitting element D2, to sense a light intensity of the light emitted by the light-emitting circuit 11 and to output the sensed light intensity signal by the sensing output terminal O1 of the photosensitive element D1. The sensed light intensity signal may be an electrical signal.

It should be appreciated that the pixel unit may be, for example, a unit structure in a display region of any display device, and the display device may be, for example, an organic light-emitting diode (OLED) display product, a quantum dot light-emitting diode (QLED) display product or a micro-light emitting diode (Micro-LED) display product, and may also be any product or component with a display function, such as a display panel, a mobile phone, a tablet PC, a television, a display, a laptop, a digital photo frame or a navigator.

It also should be appreciated that the light-emitting element D2 may be any device with a light-emitting function, such as an OLED, a QLED or a micro-LED. The photosensitive element D1 may be any device that may detect the light intensity and convert the detected light intensity into an electrical signal, such as a photo-diode, a photo-transistor or a photo-resistor. The photosensitive element D1 may include a first electrode, a photosensitive material layer PIN and a second electrode, wherein the first electrode is made from a transparent conductive material and is connected to a bias signal terminal that is configured to provide a bias voltage, and the second electrode is made from a light-shielding material and is connected to the switch circuit 12 as the sensing output terminal of the photosensitive element D1. The function of the switch circuit 12 may be achieved by at least one of a thin film transistor (TFT), a metal-oxide-semiconductor field-effect transistor (MOSFET), a diode, a Hall element, a memristor and a relay. Certainly, the implementation according to this embodiment is not limited to the above example.

In one example, the external control circuit 00 may realize compensation (hereinafter referred to as optical compensation) for the change of the self-illuminating efficiency of the light-emitting element D2 by the following means: prior to start of each compensation cycle, acquiring the sensed light intensity signal once, wherein every two adjacent compensation cycles may be separated by a certain cycle, for example, one or more display frames. During acquisition of the sensed light intensity signal, the switch control signal may be provided for the switch circuit 12, such that the switch circuit 12 controls the sensing output terminal O1 of the photosensitive element D1 to be electrically connected to the sensing signal line SL. Afterwards, the external control circuit 00 may acquire a voltage sampling value sequence within a corresponding time internal by the sensing signal line SL as an acquisition result of the sensed light intensity signal. Afterwards, the external control circuit may perform noise suppression and integral operation on the acquisition result to obtain a time accumulated value of the light intensity of light emitted by the light-emitting element D2 within a corresponding time interval, namely, an actual light intensity of light emitted by the light-emitting element D2. It should be appreciated that the time accumulated value of the light intensity and light-emitting control data of the light-emitting element D2 within the corresponding time interval (such as a terminal voltage and a terminal current of the light-emitting element D2 or a data voltage of a data signal written into the pixel unit Px) may be combined to reflect the luminous efficiency of the light-emitting element D2. Thus, the luminance of the light-emitting element D2 may be adjusted based on the time accumulated value of the light intensity. Accordingly, compensation for the change of the self-illuminating efficiency of the light-emitting element D2 is realized. The light-emitting control data of the light-emitting element D2 within the corresponding time interval may refer to actual light-emitting control data for driving the light-emitting element D2 within the time interval in which the photosensitive element D1 senses the light emitted by the light-emitting element D2.

In one example, the external control circuit 00 may be a source driving circuit. A switch signal terminal that provides the switch control signal for the switch circuit 12 may be an output terminal of a gate driving circuit.

In an exemplary implementation, compensation quantity data, for example, a compensation quantity table in which a corresponding relationship among a light intensity, the light-emitting control data and a compensation quantity is recorded, obtained by experimental calibration may be stored in the external control circuit. Taking the time accumulated value of the light intensity and the actual light-emitting control data (for example, a data voltage of a data signal) of the light-emitting element D2 within a corresponding time interval as indexes, in the compensation quantity table, the external control circuit may acquire a target compensation quantity (for example, acquire a target compensation quantity of the data signal) of the light-emitting control data within the next compensation cycle by means of table lookup, and at the start of the next compensation cycle, utilizes the light-emitting control data on which the target compensation quantity is superimposed to control the luminance of the light-emitting element D2, such that the change of the self-illuminating efficiency of the light-emitting element D2 is compensated. The above process is continuously repeated with changes of the compensation cycles. Thus, differences between the luminous efficiency of the light-emitting elements D2 of different pixel units Px may be compensated, such that the luminance uniformity of various pixel units Px is improved. Moreover, such problems as darkening of a picture due to gradual decrease of the luminous efficiency of the light-emitting element D2 with service time may be solved, which helps to prolong the product service life.

It may be seen from above that based on the structure of the pixel unit according to the embodiment of the present disclosure, the external control circuit may acquire a sensed signal relevant to the change of the self-illuminating efficiency of the light-emitting element when the sensing output terminal is electrically connected to the sensing signal line. Based on this, compensation for the change of the self-illuminating efficiency of the light-emitting element may be realized with reference to external calculation and adjustment of the light-emitting control data, which helps to improve the luminance uniformity and to prolong the service life of a self-luminous display device.

It should be appreciated that the above-mentioned pixel unit may further realize the compensation for the change of the self-illuminating efficiency with reference to acquisition, calculation and compensation processes in other forms, not limited to the foregoing examples. Besides, for a display device with an internal, external or internal and external hybrid electrical compensation function, the acquisition, calculation and compensation processes maybe combined with an electrical compensation process.

Figure 3:
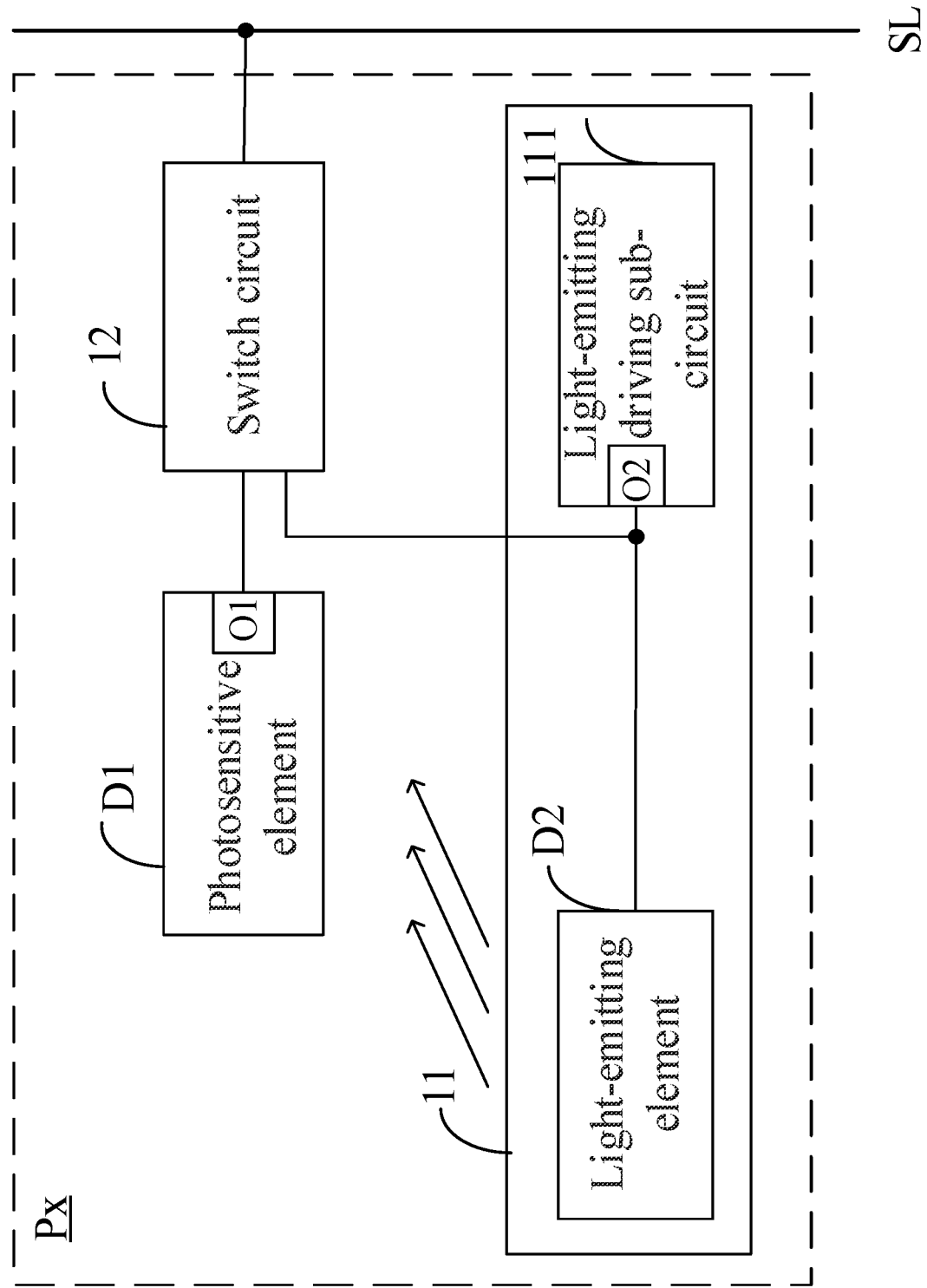
FIG. 3 is a structural block diagram of a pixel unit in accordance with yet another embodiment of the present disclosure.

FIG. 3 is a structural block diagram of a pixel unit in accordance with yet another embodiment of the present disclosure. Referring to FIG. 3, the light-emitting circuit 11 of the pixel unit Px further includes a light-emitting driving sub-circuit 111, of which a light-emitting current output terminal O2 is connected to one electrode (the terminal led out from the right side of the light-emitting element D2 in FIG. 3) of the light-emitting element D2. Besides, the switch circuit 12 is further connected to the light-emitting current output terminal O2 of the light-emitting driving sub-circuit 111, and is further configured to: control an ON/OFF state between the light-emitting current output terminal O2 and the external control circuit 00 based on a received switch control signal. For example, referring to FIG. 3, the switch circuit 12 may be connected to the external control circuit 00 by the sensing signal line SL. Thus, the switch circuit 12 may control an ON/OFF state between the light-emitting current output terminal O2 and the sensing signal line SL.

It should be understood that the light-emitting driving sub-circuit 111 may be, for example, any circuit structure capable of outputting a current of a specified magnitude and may be implemented with reference to pixel driving circuits of various light-emitting elements in the related art. In addition, when the light-emitting current output terminal O2 and the sensing signal line SL are electrically connected, the external control circuit 00 may acquire an electrical signal of the luminance of the light-emitting element D2 by the sensing signal line SL and realize an electrical compensation accordingly.

In one example, the electrical compensation process may be combined with the foregoing optical compensation process by the following means: each display frame sequentially includes a first time interval, a second time interval and a third time interval from beginning to end.

In the first time interval, the light-emitting driving sub-circuit 111 writes in the data voltage and stops outputting current. At this time, the switch circuit 12 controls the sensing signal line SL to be electrically disconnected from the light-emitting current output terminal O2 and the sensing output terminal O1.

In the second time interval, the light-emitting driving sub-circuit 111 provides the light-emitting current for the light-emitting element D2 based on the written-in data voltage to enable the light-emitting element D2 to emit light. In the second time interval, the switch circuit 12 controls the sensing signal line SL to be electrically disconnected from the light-emitting current output terminal O2 and to be electrically connected to the sensing output terminal O1, such that the external control circuit 00 connected to the sensing signal line SL may accomplish acquisition of the sensed light intensity signal.

In the third time interval, the light-emitting driving sub-circuit 111 keeps working. At this time, the switch circuit 12 controls the sensing signal line SL to be electrically connected to the light-emitting current output terminal O2 and to be electrically disconnected from the sensing output terminal O1, such that the external control circuit 00 connected to the sensing signal line SL may accomplish acquisition of the data (for example, light-emitting current) for electrical compensation.

The data voltage written into the light-emitting driving sub-circuit 111 within the first time interval of each display frame may be a data voltage obtained after optical compensation and electrical compensation are performed based on the sensed light intensity signal acquired by the previous display frame and the data for electrical compensation.

For the compensation mode, optical compensation and electrical compensation may be performed sequentially or simultaneously. Moreover, the compensation quantities of the optical compensation and the electrical compensation may be selected within a possible range in accordance with application demands and compensation precision based on a compensation calculation relationship obtained by theoretical calculation and/or experimental determination. In this way, the electrical compensation process and the optical compensation process may be combined.

It thus may be seen that based on the pixel unit according to this embodiment, a sensed signal (namely, the data for electrical compensation) relevant to drift of a threshold voltage of the driving transistor in the light-emitting driving circuit may be acquired when the light-emitting current output terminal is electrically connected to the sensing signal line, and a sensed signal (namely, the sensed light intensity signal) relevant to the change of the self-illuminating efficiency of the light-emitting element may be acquired when the sensing output terminal is electrically connected to the sensing signal line. Therefore, the optical compensation and the electrical compensation may be realized simultaneously with reference to external calculation and adjustment of the light-emitting control data (for example, the data voltage of the data signal).

It should be understood that in addition to using the same sensing signal line SL to acquire data for electrical compensation and the sensed light intensity signal, different signal lines may also be used to acquire data for electrical compensation and the sensed light intensity signal. However, compared with the implementation that different signal lines are used, this embodiment has the advantages that under control of the switch circuit, the data for electrical compensation and the sensed light intensity signal may be acquired at different time, such that an additional sensing signal line may be omitted, which helps to improve the pixel aperture ratio and the display uniformity, as well as the display performance.

In this embodiment, the switch circuit 12 may be configured to be connected to a first switch signal terminal and a second switch signal terminal. The switch circuit 12 may receive a first switch signal in the switch control signal by the first switch signal terminal and control the ON/OFF state between the sensing output terminal O1 and the external control circuit 00 based on the first switch signal. The switch circuit 12 may further receive a second switch signal in the switch control signal by the second switch signal terminal, and control the ON/OFF state between the light-emitting current output terminal O2 and the external control circuit 00 based on the second switch signal.

Figure 4:
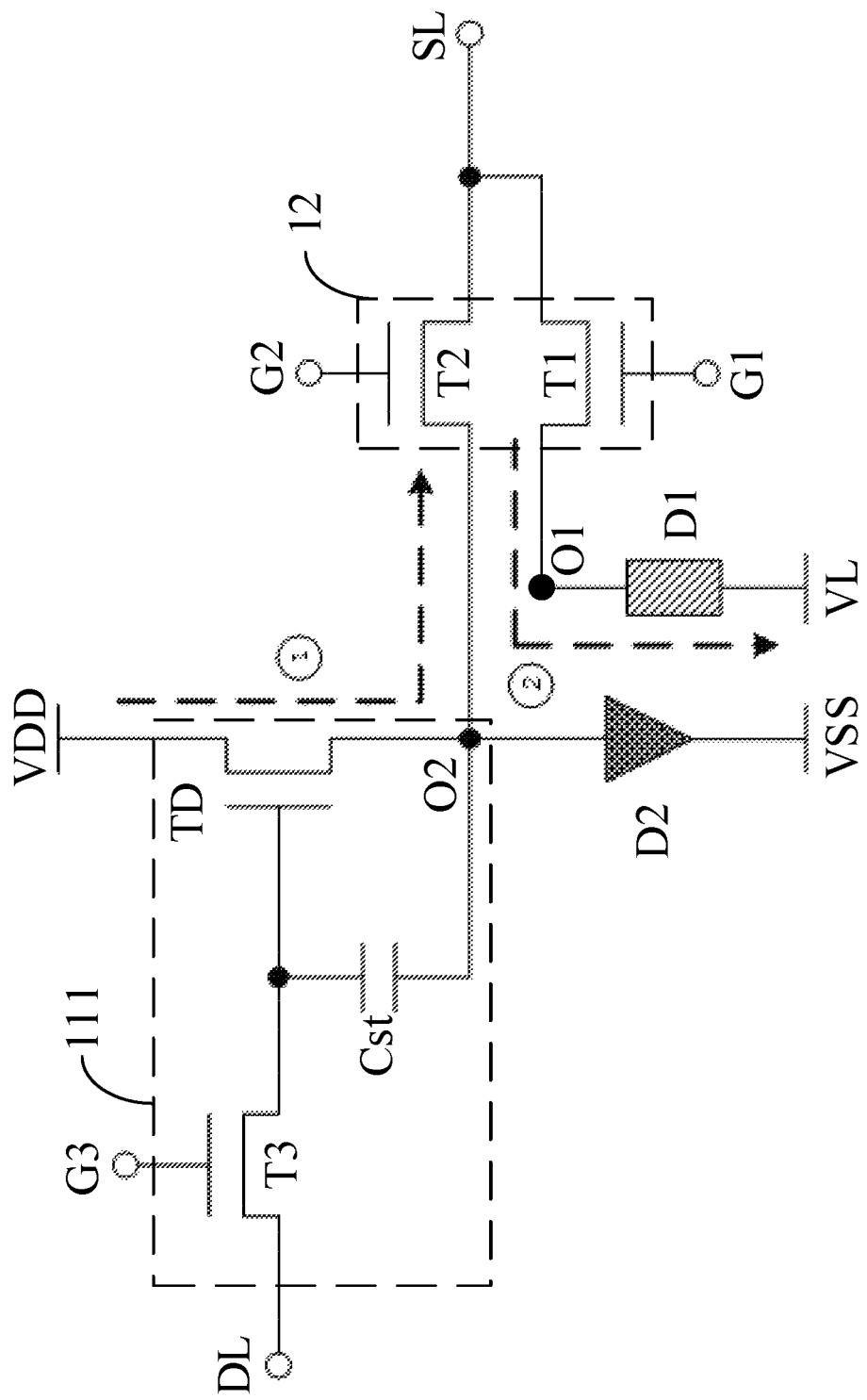
FIG. 4 is a schematic structural diagram of a circuit of a pixel circuit in accordance with an embodiment of the present disclosure.

FIG. 4 is a schematic structural diagram of a pixel circuit in accordance with one embodiment of the present disclosure. By example, referring to FIG. 4, the switch circuit 12 may be connected to the first switch signal terminal by a first switch signal line G1 and may further be connected to the second switch signal terminal by a second switch signal line G2.

Continuously referring to FIG. 4, the switch circuit 12 may include a first transistor T1 and a second transistor T2. A gate of the first transistor T1 is connected to the first switch signal line G1. One of a source and a drain of the first transistor T1 may be configured to be connected to the external control circuit 00, for example, to be connected to the external control circuit 00 by the sensing signal line SL, and the other thereof is connected to the sensing output terminal O1. A gate of the second transistor T2 is connected to the second switch signal line G2. One of a source and a drain of the second transistor T2 is configured to be connected to the external control circuit 00, and the other thereof is connected to the light-emitting current output terminal O2 (namely, an anode of a diode used as the light-emitting element D2 in FIG. 4).

It should be noted that the switch circuit 12 may further be only connected to one switch signal terminal configured to provide the switch control signal. Correspondingly, the switch circuit 12 may only include one first transistor T1. A gate of the first transistor T1 may be connected to the switch signal terminal by the switch signal line. One of a source and a drain of the first transistor T1 is configured to be connected to the external control circuit 00, and the other thereof is connected to the sensing output terminal O1. The first transistor T1 may control the ON/OFF state between the sensing output terminal O1 and the external control circuit 00 under control of the switch control signal.

Referring to FIG. 4, the pixel unit Px according to this embodiment is further connected to a gate line G3, a data line DL, a bias voltage line VL, a light-emitting power supply positive terminal VDD and a light-emitting power supply negative terminal VSS. The light-emitting driving sub-circuit 111 may receive a data voltage from the data line DL under control of a gate signal on the gate line G3. The data line DL may be connected to the external control circuit 00. The external control circuit 00 may provide the data voltage for the light-emitting driving sub-circuit 111 by the data line DL. The photosensitive element D1 may obtain a stable working voltage based on a connection to the bias voltage line VL to output the sensed light intensity signal. The light-emitting driving sub-circuit 111 may output a light-emitting current to the light-emitting element D2 under power supply from the light-emitting power supply positive terminal VDD. The light-emitting element D2 may receive the light-emitting current output by the light-emitting driving sub-circuit 111 and emit light based on a connection to the light-emitting power supply negative terminal VSS.

By example, referring to FIG. 4, the light-emitting driving sub-circuit 111 may include a third transistor T3, a storage capacitor Cst and a driving transistor TD.

A gate of the third transistor T3 is connected to the gate line G3. One of a source and a drain of the third transistor T3 is connected to the data line DL, and the other thereof is connected to a gate of the driving transistor TD. One of a source and a drain of the driving transistor TD is connected to the light-emitting current output terminal, and the other thereof is connected to the light-emitting power supply positive terminal VDD in a light-emitting power supply terminal. A first terminal (namely, an upper terminal of the storage capacitor Cst in FIG. 4) of the storage capacitor Cst is connected to the gate of the driving transistor TD. A second terminal of the storage capacitor Cst (namely, a lower terminal of the storage capacitor Cst in FIG. 4) is connected to the light-emitting current output terminal.

It should be noted that respective connection relationships of the source and the drain of the transistor may be set based on different specific types of the transistors to match a direction of current flowing by the transistor. When the transistor adopts the structure that the source and the drain are symmetric, the source and the drain may be regarded as two electrodes which are not specially distinguished.

In one example, all of the first transistor T1, the second transistor T2, the third transistor T3 and the driving transistor TD may be N-type transistors. The photosensitive element D1 may be a p-i-n photo-diode (pin-PD). Thus, the pixel unit shown in FIG. 4 may observe the following operating process.

At the start of each display frame, the third transistor T3 is started under the action of a high level on the gate line G3, such that the storage capacitor Cst is charged by the data voltage on the data line DL, and writing in of the data voltage is accomplished till the data voltage is at the first terminal of the storage capacitor. After that, the storage capacitor Cst may lock a gate-source voltage of the driving transistor TD as the data voltage, such that a source/drain current of the driving transistor TD is locked as a current value corresponding to a voltage value of the gate-source voltage to achieve the function that the light-emitting driving sub-circuit 111 outputs the light-emitting current to the light-emitting element D2. Thus, the light-emitting element D2 receives the light-emitting current by the light-emitting driving sub-circuit 111 and emits light in accordance with luminance that corresponds to the current value of the light-emitting current.

When the light-emitting element D2 emits light stably, the first switch signal line G1 may be transformed to a high level, and the second switch signal line G2 may keep a low level, such that the first transistor T1 is turned on and the second transistor T2 is turned off. At this time, under a bias voltage provided by the bias voltage line VL, the photosensitive element D1 works in a reverse bias state. The photosensitive element D1 may receive light emitted by the light-emitting element D2 and produce light current. Referring to the direction shown by a mark "@" in FIG. 4, the light current flows from the sensing output terminal O1 to the bias voltage line VL. Based on this, an electrical signal that serves as the sensed light intensity signal may be acquired on the sensing signal line SL. Data for optical compensation is obtained by calculation.

When the display frame is going to end, the first switch signal line G1 may be transformed to a low level, and the second switch signal line G2 may be transformed to a high level, such that the second transistor T2 is turned on and the first transistor T1 is turned off. At this time, a part of current output by the driving transistor TD may flow to the sensing signal line SL in the direction shown by a mark "D" in FIG. 4. Based on this, an electrical signal may be acquired on the sensing signal line SL. Data for electrical compensation is obtained by calculation.

The external control circuit 00 may adjust the data voltage that is written into the light-emitting driving sub-circuit 111 by the data line DL with reference to the data for optical compensation of the data for electrical compensation. Thus, the optical compensation and the electrical compensation are realized in a display process.

It should be understood that the circuit structure shown in FIG. 4 and the above-mentioned operating process are only an example, the implementation of this embodiment may be adjusted in a specific application scenario according to application requirements.

In an exemplary implementation, the first transistor T1 and the second transistor T2 may be respectively set as one of an N-type transistor and a P-type transistor, and the first switch signal line G1 and the second switch signal line G2 are merged into one switch signal line. In this way, the ON/OFF state of the first transistor T1 and the ON/OFF state of the second transistor T2 may be exchanged by transition of the high level and the low level on the switch signal line. Owing to this implementation, one switch signal line and one switch signal terminal may be omitted simultaneously during implementation of the above operating process, which helps to improve the pixel aperture ratio and the display performance.

In another example, the light-emitting power supply positive terminal VDD and the light-emitting power supply negative terminal VSS may be exchanged. Meanwhile, two poles of the light-emitting element D2 are overturned to implement the above-mentioned operating process.

Figure 5:
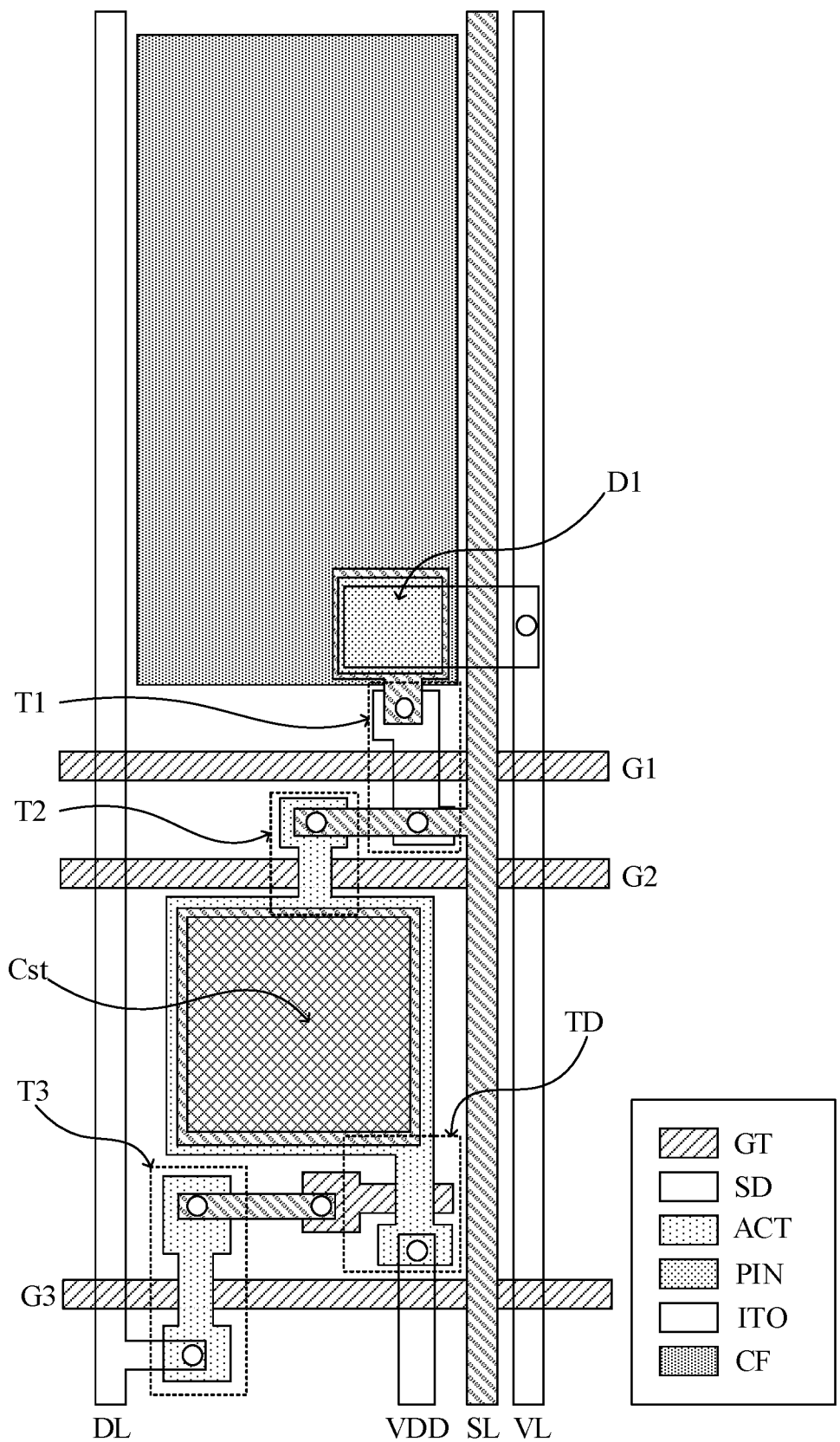
FIG. 5 is a schematic structural diagram of a pixel unit in accordance with an embodiment of the present disclosure.
Figure 6:
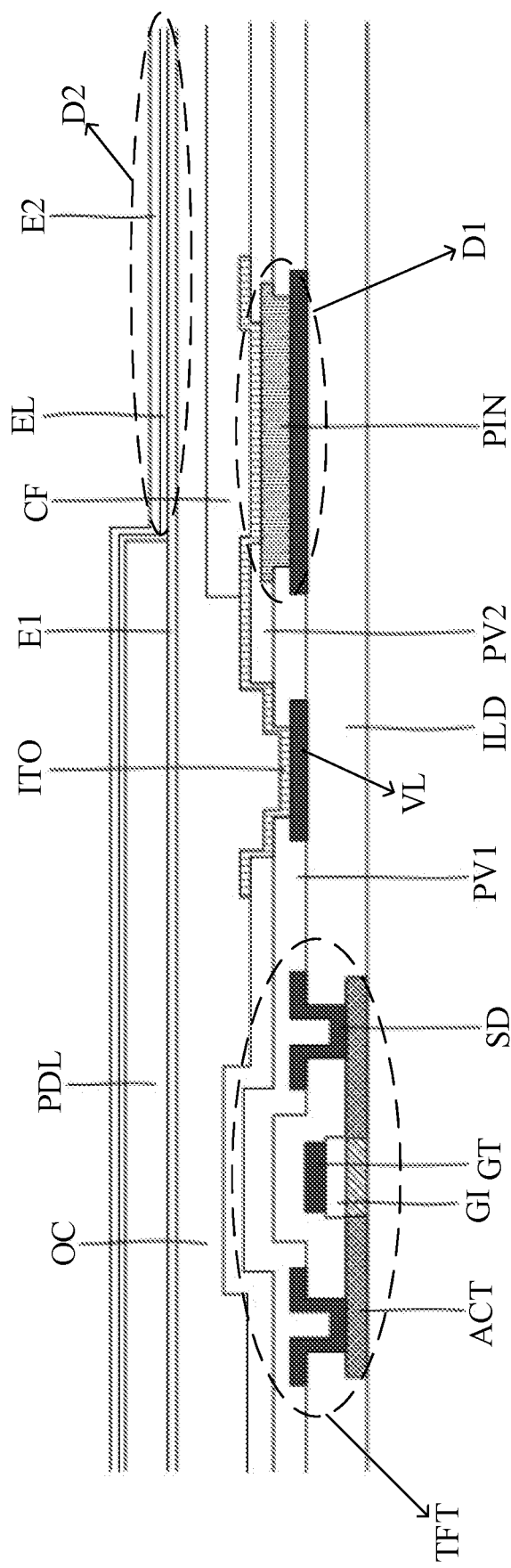
FIG. 6 is a schematic structural diagram of a section of a pixel unit in accordance with one embodiment of the present disclosure.

FIG. 5 is a schematic structural diagram of a pixel unit according to an embodiment of the present disclosure. FIG. 6 is a schematic sectional structural diagram of the pixel unit shown in FIG. 5. Referring to FIG. 5 and FIG. 6, the pixel unit may include an active layer ACT, a gate insulating layer GI, a gate conductive layer GT, an interlayer dielectric layer ILD, a source/drain conductive layer SD, a first passivation layer PV1, a photosensitive material layer PIN, a second passivation layer PV2, a transparent conductive layer ITO, a color filter layer CF, a planarization layer OC, an anode conductive layer E1, a pixel defining layer PDL, an organic light-emitting layer EL and a cathode conductive layer E2 which are sequentially disposed in a thickness direction. The pixel unit may be disposed on a base substrate. The thickness direction may be perpendicular to a bearing surface of the base substrate.

The pixel unit according to this embodiment may be provided with the circuit structure shown in FIG. 4. The first transistor T1, the second transistor T2, the third transistor T3 and the driving transistor TD are all TFTs, of which a layered structure may be as shown by the TFT in FIG. 6.

Referring to FIG. 6, the light-emitting element D2 in this embodiment may include an anode in the anode conductive layer E1, an organic light-emitting structure disposed in the organic light-emitting layer EL and a cathode in the cathode conductive layer E2 (for the clarity, the light-emitting element D2 is not shown in FIG. 5).

Referring to FIG. 6, the first electrode in the photosensitive element D1 may be connected to the bias signal terminal by the bias voltage line VL, and the second electrode may be connected to a source of the first transistor T1. The bias voltage provided by the bias signal terminal may be −5 V to 0 V.

In one example, the photosensitive material layer PIN may include a P-type semiconductor material layer, an I-type semiconductor material layer and an N-type semiconductor material layer which are sequentially stacked in a direction distal from the light-emitting element D2. Thus, the p-i-n photo-diode described above may be formed.

In one example, the first electrode, the photosensitive material layer PIN and the second electrode may be sequentially stacked in a direction distal from the light-emitting element D2. The second electrode may be made from a light-shielding material and may shield light irradiated toward the photosensitive material layer PIN. For example, the second electrode may be in the source/drain conductive layer SD. That is, the second electrode may be disposed on the same layer as the source and the drain of the transistor included by the switch circuit 12 and may be made of the same metal material as the source and the drain. The first electrode may be made from a transparent conductive material. For example, the first electrode may be in the transparent conductive layer ITO and may be made from a transparent indium tin oxide (ITO) material.

It should be understood in the text that different structures in the same layer may be formed, for example, in the same time of a patterning process, and may also be obtained, for example, by performing a patterning process on the same film layer, which are not limited thereto.

Understandably, a second electrode of the photosensitive element D1 is disposed in the source/drain conductive layer SD, such that the light-shielding property of the metal material of the source/drain conductive layer may be utilized to enable the second electrode to shield light irradiated from below toward the photosensitive material layer PIN. In this way, interference caused by ambient light to acquisition of the sensed light intensity signal may be reduced, and the photosensitive element D1 may be covered during display, which helps to improve a display effect and an optical compensation effect. Certainly, shielding of light, by the second electrode, irradiated toward the photosensitive material layer may be realized by other means, for example, by the means of disposing the second electrode in the gate conductive layer GT, which is not limited thereto.

In one example, the active layer ACT in FIG. 5 and FIG. 6 is made from a conducting channel semiconductor material in regions that overlap the gates of the transistors in the gate conductive layer GT, such that the overlapping regions may form active regions of the transistors. However, the active layer ACT other than the overlapping regions is made from a semiconductor material subjected to conduction treatment. Thus, the sources and the drains of the transistors in the source/drain conductive layer SD may be connected to the active layer ACT by a by hole in the interlayer dielectric layer ILD to form a top-gate TFT structure.

Referring to FIG. 5, the source and the drain (in the source/drain conductive layer SD) of the third transistor T3 are respectively disposed at the upper side and the lower side of the gate (in the gate conductive layer GT) of the third transistor T3 and respectively connected to the gate of the driving transistor TD and the data line DL in the source/drain conductive layer SD. The source and the drain (in the source/drain conductive layer SD) of the driving transistor TD are respectively disposed at the upper side and the lower side of its gate (in the gate conductive layer GT) and respectively connected to the voltage line, configured to provide the light-emitting power supply positive voltage terminal VDD, in the source/drain conductive layer SD and the second terminal of the storage capacitor Cst.

It should be understood that a polar plate at the second terminal, in the source/drain conductive layer SD, of the storage capacitor Cst may simultaneously serve as the source of the driving transistor TD and the drain of the second transistor T2. A connection mode between a polar plate at the first terminal, in the transparent conductive layer ITO, of the storage capacitor Cst and the gate of the driving transistor TD is not shown in FIG. 5 or FIG. 6.

In an example of the connection mode, the polar plate at the first terminal, in the transparent conductive layer ITO, of the storage capacitor Cst and the gate of the driving transistor TD may be partially overlapping. A connection by hole may be formed in the interlayer dielectric layer ILD, the first passivation layer PV1 and the second passivation layer PV2 in the overlapping region. The polar plate at the first terminal of the storage capacitor Cst may be connected to the gate of the driving transistor TD by the connection by hole.

Referring to FIG. 5, the drain and the source (in the source/drain conductive layer SD) of the second transistor T2 are respectively disposed at the upper side and the lower side of its gate (in the gate conductive layer GT), and the source of the second transistor T2 simultaneously serves as the drain of the first transistor T1 and is connected to the sensing signal line SL in the source/drain conductive layer SD. The source and the drain (in the source/drain conductive layer SD) of the first transistor T1 are respectively disposed at the upper side and the lower side of its gate (in the gate conductive layer GT), and the source of the first transistor T1 may simultaneously serve as the second electrode of the photosensitive element D1.

Referring to FIG. 5 and FIG. 6, the first electrode, in the transparent conductive layer ITO, of the photosensitive element D1 and the bias voltage line VL in the source/drain conductive layer SD are partially overlapping. A connection by hole is formed in the first passivation layer PV1 and the second passivation layer PV2 in the overlapping region. The first electrode of the photosensitive element D1 may be connected to the bias voltage line VL by the connection by hole. For the clarity, the sensing signal line SL between the photosensitive element D1 and the bias voltage line VL is not drawn in FIG. 6.

Referring to FIG. 6, the color filter layer CF (also called a color film layer) may be disposed on one side (namely, a light-exiting side) of the light-emitting element D2. For example, the color filter layer CF may be disposed on the side, distal from the light-emitting element D2, of the pixel defining layer PDL. The photosensitive element D1 is disposed on the side, distal from the light-emitting element D2, of the color filter layer CF. By example, there is an overlapping region between an orthographic projection of the light-emitting element D2 on the base substrate and an orthographic projection of the color filter layer CF on the base substrate. An orthographic projection of the photosensitive element D1 on the base substrate may be in this overlapping region.

Understandably, based on the design that the photosensitive element D1 is disposed on the side, distal from the light-emitting element D2, of the color filter layer CF, light emitted by the light-emitting element D2 is received by the photosensitive element D1 by the color filter layer CF. At this time, based on the sensed light intensity signal acquired by the photosensitive element D1, not only information, such as luminous intensity, luminance or luminous efficiency, about the light-emitting element but also information about light luminance decay of the color filter layer CF and information about pixel light color offset may be obtained, which helps to perform optical detection and trouble shooting and makes autocorrection of color offset be possible.

In this embodiment, referring to FIG. 5, the pixel unit Px may be provided with a first region (a region other than the color filter layer CF in FIG. 5) where the pixel defining layer PDL is disposed and a second region (a region where the color filter layer CF is disposed in FIG. 5) surrounded by the first region. The switch circuit 12 that includes the first transistor T1 and the second transistor T2, as well as the light-emitting driving sub-circuit 111 that includes the third transistor T3, the storage capacitor Cst and the driving transistor TD, is in the first region. The light-emitting element D2 and the photosensitive element D1 are in the second region. The color filter layer CF in the second region and the light-emitting element D2 in the second region overlap each other to ensure that light emitted by the light-emitting element D2 is emitted after passing by the color filter layer CF.

In a positional relationship of a plane layout, the switch circuit 12 is disposed on one side (the lower side in FIG. 5 and the left side in FIG. 6) of the second region, the light-emitting driving sub-circuit 111 is disposed on the side, distal from the second region, of the switch circuit 12, and the photosensitive element D1 is disposed at an edge, proximal to the switch circuit 12, of the second region.

In one example, the pixel defining layer PDL may be made from a light-shielding material (for example, a material for making a black matrix). Understandably, based on relevant settings of the pixel defining layer PDL, stray light in the first region may be covered by the definition layer PDL. Thus, interference to light emitted by the light-emitting element D2 in the second region and sensing of the photosensitive unit D1 may be less. That is, light noise interference at the periphery of a pixel opening may be reduced, which helps to improve a display effect and an optical compensation effect.

In this embodiment, the first switch signal line G1 and the second switch signal line G2 may be in the gate conductive layer GT where the gates of the first transistor T1 and the second transistor T2 are disposed. That is, the first switch signal line G1, the second switch signal line G2 and the gates of the first transistor T1 and the second transistor T2 may be disposed on the same layer and may be formed by one time of a patterning process. Thus, the first switch signal line G1 and the second switch signal line G2 may be implemented in accordance with the layout and the connection mode of the gate line G3, which helps to save the layout space and to simplify the technological process.

In this embodiment, the bias voltage line VL and the sensing signal line SL may be disposed on the same layer and made from the same material, and may extend in the same direction. Since the first electrode and the bias voltage line VL are connected, the bias voltage line may be implemented in accordance with the layout and the connection mode of the data line DL, which helps to save the layout space and to simplify the technological process. For example, referring to FIG. 6, the bias voltage line VL and the sensing signal line SL may be parallel to the data line DL. However, the connection mode between the first electrode of the photosensitive element D1 and the bias signal terminal may be achieved by but not limited to the bias voltage line VL.

Figure 7:
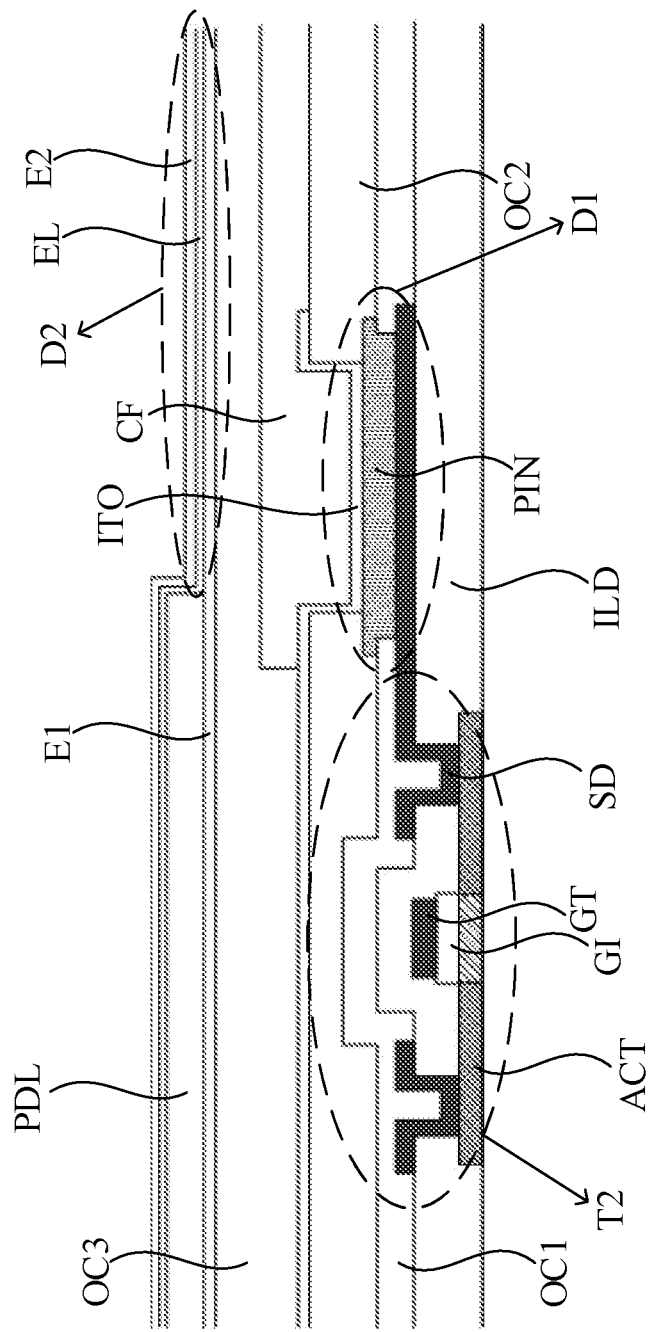
FIG. 7 is a schematic structural diagram of a section of a pixel unit in accordance with another embodiment of the present disclosure.

As an example, FIG. 7 is a schematic diagram of a sectional structure of a pixel unit in accordance with yet another embodiment of the present disclosure. By comparison between FIG. 6 and FIG. 7, it may be seen that in the pixel unit shown in FIG. 7, the first passivation layer PV1 in FIG. 6 is replaced with a first planarization layer OC1 and the second passivation layer PV2 in FIG. 6 is replaced with a second planarization layer OC2, the planarization layer OC in FIG. 6 serves as a third planarization layer OC2 in FIG. 7, and the transparent conductive layer ITO where the first electrode is disposed transversely extends out of the pixel unit (or out of a display region of the display device where the pixel unit is disposed) to be connected to the bias signal terminal.

In this embodiment, in addition to providing the connection by hole between the transparent conductive layer ITO and the photosensitive material layer PIN, the second planarization layer OC2 also provides a flat forming surface for the transparent conductive layer ITO, such that the transparent conductive layer ITO may be arranged in a linear, latticed or whole-surface manner. Thus, as the first electrodes of the photosensitive elements D1 in all the pixel units on the entirety, the transparent conductive layer ITO is connected to the bias signal terminal outside the pixel unit and conducts a bias voltage provided by the bias signal terminal to each pixel unit.

Comparatively, the bias voltage connection mode shown in FIG. 6 may has a smaller resistance drop (IR Drop), and the transparent conductive layer ITO may not be disposed in a light-transmitting region. Thus, a higher luminance may be achieved. The bias voltage connection mode shown in FIG. 7 may omit the bias voltage line VL between the pixel units. Thus, the process difficulty may be reduced. Moreover, the risk of a short circuit between the bias voltage line VL and other conductor structures may be avoided, which helps to increase the aperture ratio.

With respect to the implementation of the storage capacitor Cst in FIG. 5, in yet another example, the active layer ACT between the first switch signal line G1 and the gate of the driving transistor TD is disconnected from the source/drain conductive layer in FIG. 5 (that is, there is no connection by holes of the active layer ACT and the source/drain conductive layer SD in the interlayer dielectric layer ILD). At this time, this portion of active layer ACT serves as a lower polar plate of the storage capacitor Cst, the source of the driving transistor TD and the drain of the second transistor T2, and this portion of source/drain conductive layer SD is connected to the gate of the driving transistor TD by a by hole in the interlayer dielectric layer, and may serve as an intermediate polar plate of the storage capacitor Cst. The anode conductive layer E1 may serve as an upper polar plate of the storage capacitor. Besides, the upper polar plate of the storage capacitor Cst and the anode of the light-emitting element D2 may be connected to the source of the driving transistor TD. The connection by holes between the upper polar plate of the storage capacitor Cst and the anode of the light-emitting element D2 and the source of the driving transistor TD may be in the first passivation layer PV1, the second passivation layer PV2 and the planarization layer OC, and may also be, for example, formed at the top right corner of a square region of the storage capacitor Cst in FIG. 5.

In this way, both the upper polar plate and the lower polar plate of the storage capacitor Cst are connected to the source of the driving transistor TD. The intermediate polar plate of the storage capacitor Cst is connected to the gate of the driving transistor TD. Thus, two shunt-wound capacitors are formed. Compared with other implementations of the storage capacitor Cst, this implementation is more conductive to increasing the capacitance of the storage capacitor Cst, reducing an area, taken up by the storage capacitor Cst, in the pixel unit, and increasing the aperture ratio.

It should be appreciated that all the transistors in the above examples of the pixel unit are implemented by top gate (TG) device structures. In other implementations, an etch stopper type (ESL), a back channel etch type (BCE) or a bottom gate type (BG) device may also be adopted.

It also should be appreciated that the pixel unit shown in FIG. 5 and FIG. 6 may further include a base substrate that is not shown. The base substrate is disposed on the side, distal from a gate insulating layer GI, of the active layer ACT. Thus, a pixel unit of a bottom-emission while-light OLED display device may be implemented.

Figure 8:
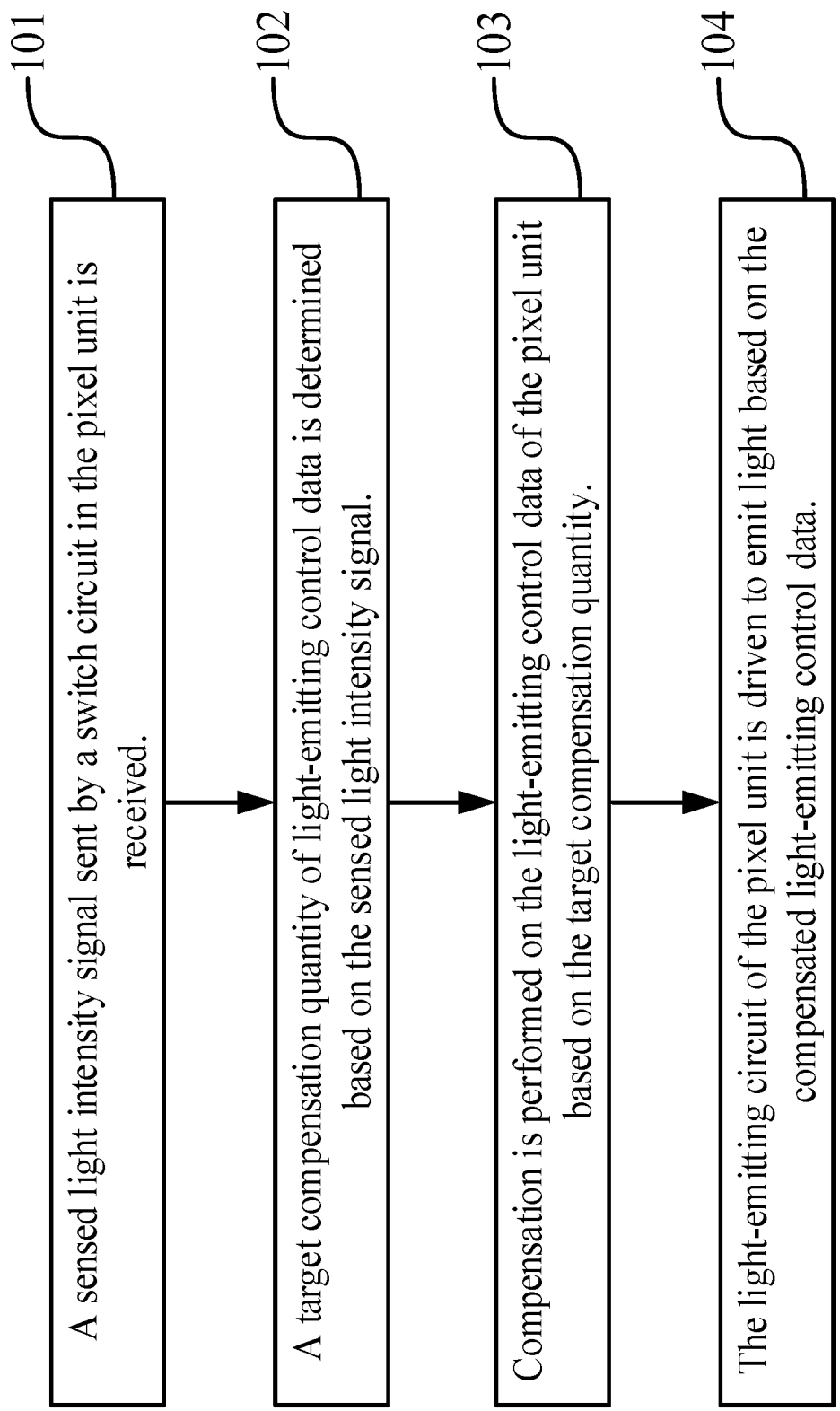
FIG. 8 is a schematic flowchart of a compensation method of a pixel unit in accordance with an embodiment of the present disclosure.

Based on the same inventive concept, an embodiment of the present disclosure provides a compensation method of a pixel unit, which may be applied to an external control circuit and may also be configured to compensate for the pixel unit according to the above embodiments. Referring to FIG. 8, the compensation method may include:

In step 101, a sensed light intensity signal sent by a switch circuit in the pixel unit is received.

The sensed light intensity signal is obtained by sensing, by a photosensitive element in the pixel unit, a light intensity of light emitted by a light-emitting circuit of the pixel unit. In this embodiment, the external control circuit may perform optical compensation once on the pixel unit every certain cycle. Prior to an optical compensation, a switch control signal may be output to a switch circuit 12 of the pixel unit Px first, such that the switch circuit 12 electrically connects a sensing output terminal O1 of the photosensitive element D1 to a sensing signal line SL. At this time, the external control circuit may receive the sensed light intensity signal, obtained by sensing by the photosensitive element D1, by the sensing signal line SL. A switch signal terminal configured to provide a switch control signal may be an output terminal of a gate driving circuit, or may be an output terminal of a circuit independent of the gate driving circuit and the external control circuit in a display device.

By example, the external control circuit may take a voltage sampling value sequence within a corresponding time interval, acquired by the sensing signal line SL, as an acquisition result of the sensed light intensity signal. After that, noise suppression and integral operation may be performed on the acquisition result to obtain a time accumulated value of a light intensity of light emitted in the corresponding time interval by a light-emitting element D2 in a light-emitting circuit 11.

In step 102, a target compensation quantity of light-emitting control data is determined based on the sensed light intensity signal.

In an exemplary implementation, the external control circuit may determine the target compensation quantity of the light-emitting control data in accordance with the received sensed light intensity signal and the light-emitting control data provided for the pixel unit in the corresponding time interval.

Figure 9:
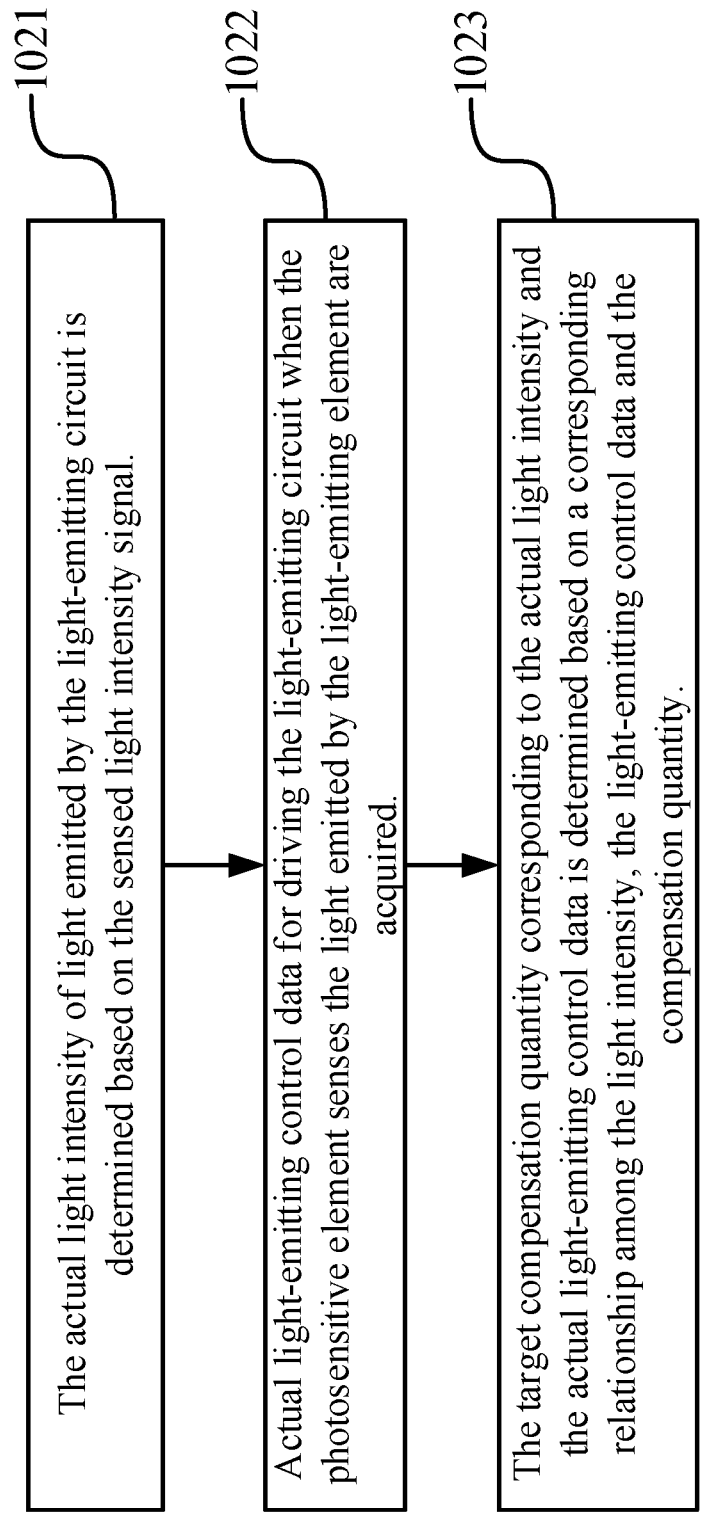
FIG. 9 is a schematic flowchart of a method for determining a target compensation quantity in accordance with an embodiment of the present disclosure.

As an optional implementation, referring to FIG. 9, the process in which the external control circuit determines the target compensation quantity may include the following steps.

In step 1021, the actual light intensity of light emitted by the light-emitting circuit is determined based on the sensed light intensity signal.

The external control circuit may determine the actual light intensity of light emitted by the light-emitting element in the light-emitting circuit based on the sensed light intensity signal.

In step 1022, actual light-emitting control data for driving the light-emitting circuit when the photosensitive element senses the light emitted by the light-emitting element are acquired.

The light-emitting control data may be a data voltage of a data signal.

In step 1023, the target compensation quantity corresponding to the actual light intensity and the actual light-emitting control data is determined based on a corresponding relationship among the light intensity, the light-emitting control data and the compensation quantity.

The corresponding relationship among the light intensity, the light-emitting control data and the compensation quantity may be obtained based on theoretical calculation and/or experimental determination and may be pre-stored in the external compensation circuit.

As another optional implementation, the external compensation circuit may determine a theoretical light intensity (namely, the light intensity of light emitted under the drive of the actual light-emitting control data when the luminous efficiency of the light-emitting element D2 is not changed) of light that should be emitted by the light-emitting element D2 under the drive of the actual light-emitting control data based on the actual light-emitting control data configured to drive the light-emitting circuit. After that, the external compensation circuit may determine the target compensation quantity of the light-emitting control data based on the determined actual difference between the actual light intensity and the theoretical light intensity of the light-emitting element D2.

In step 103, compensation is performed on the light-emitting control data of the pixel unit based on the target compensation quantity.

In an exemplary implementation, the external control circuit may superpose the target compensation quantity with the light-emitting control data to be output to the pixel unit to compensate for the light-emitting control data.

In step 104, the light-emitting circuit of the pixel unit is driven to emit light based on the compensated light-emitting control data.

The external control circuit may output the compensated light-emitting control data to a light-emitting driving sub-circuit in the light-emitting circuit of the pixel unit in the next compensation cycle. Driven by the compensated light-emitting control data, the light-emitting driving sub-circuit drives the light-emitting element to emit light, such that a change of the self-illuminating efficiency of the light-emitting element is compensated.

Based on the compensation method of the pixel unit, according to the embodiment of the present disclosure, the external control circuit may receive the sensed light intensity signal relevant to the change of the self-illuminating efficiency of the light-emitting circuit. Based on this, the compensation quantity of the light-emitting control data may be determined, and the light-emitting control data may be adjusted. Thus, the change of the self-illuminating efficiency of the light-emitting circuit may be compensated, which helps to improve the luminance uniformity and to prolong the service life of a self-luminous display device.

Based on the same inventive concept, an embodiment of the present disclosure provides a display device that includes at least one of any above-mentioned pixel unit. The display device according to this embodiment may be any product or component with a display function, such as a display panel, a mobile phone, a tablet PC, a television, a display, a laptop, a digital photo frame or a navigator.

Figure 10:
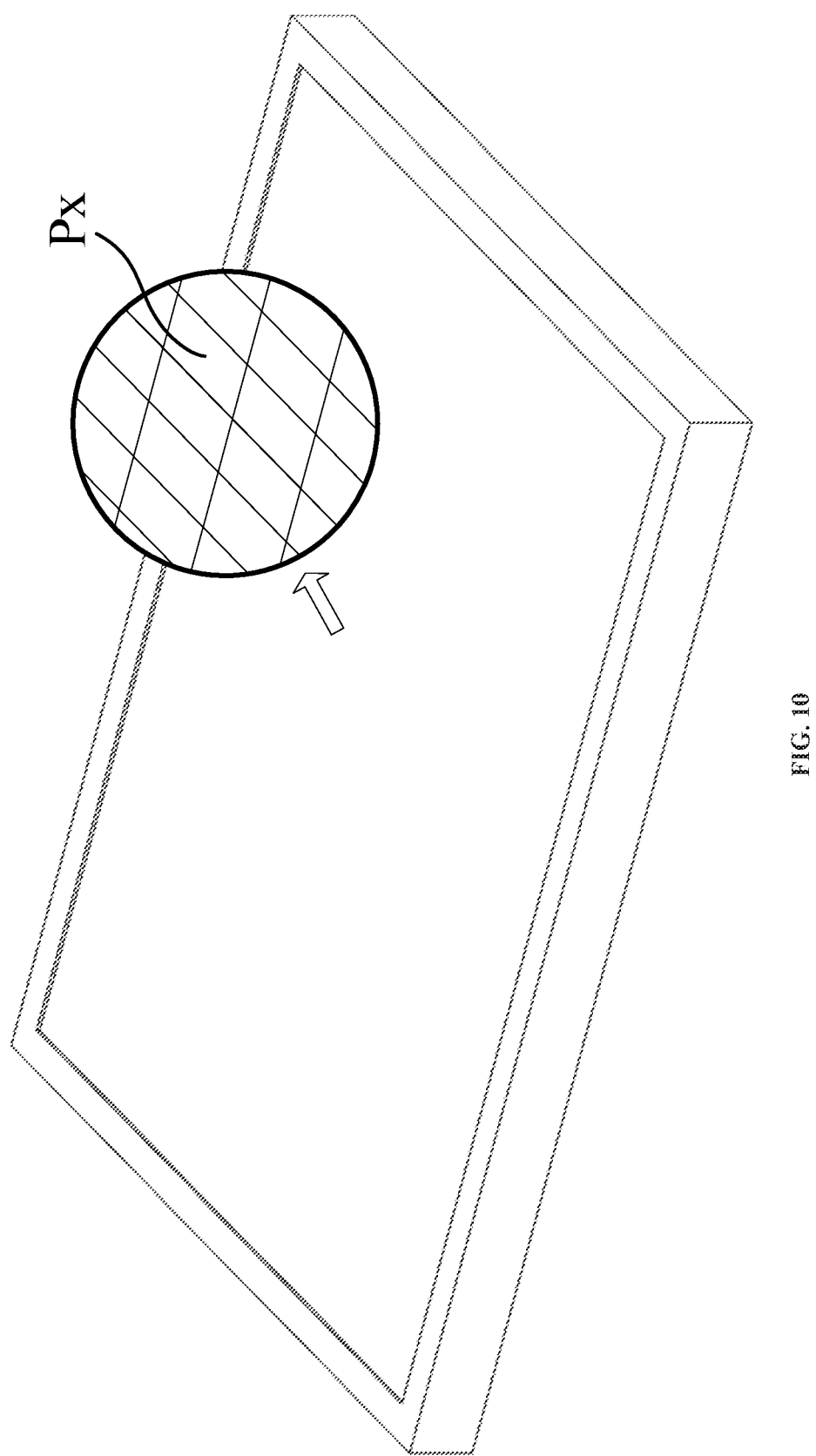
FIG. 10 is a schematic structural diagram of a display device in accordance with an embodiment of the present disclosure.

As an example, FIG. 10 is a schematic structural diagram of a display device in accordance with one embodiment of the present disclosure. Referring to FIG. 10, a plurality of pixel units Px arranged in rows and lines is disposed in a display region of the display device. Each pixel unit Px may adopt the structure shown in FIG. 5 and FIG. 6. A color filter layer CF in each pixel unit Px may be one of a red color filter layer, a blue color filter layer and a green color filter layer. Thus, a bottom-emission white-light OLED display device may be implemented based on a top gate (TG) device structure. It should be understood that the display device may also be a top-emission white-light OLED display device, a bottom-emission color-light OLED display device or a top-emission color-light OLED display device and may be not limited thereto.

As an example, the display device may further include an external control circuit 00 which may be connected to a light-emitting circuit 11 and a switch circuit 12 in each pixel unit.

As another example, the switch circuits 12 of the pixel units in the same line of the display device may be connected to the external control circuit 00 by the same sensing signal line. The light-emitting circuits 11 of the pixel units in the same line may be connected to the external control circuit 00 by the same data line DL.

In still another example, there may be only part of pixels in the display device, which adopt the structure of any above-mentioned pixel unit. At this time, a sensed light intensity signal output by a photosensitive element D1 may represent the luminance of light-emitting elements D2 in a plurality of pixel units around. Similarly, the above-mentioned optical compensation or a combination of the electrical compensation with the optical compensation may be realized.

In still another example, the display device may further include a base substrate on which all the pixel units included by the display device may be disposed.

Figure 11:
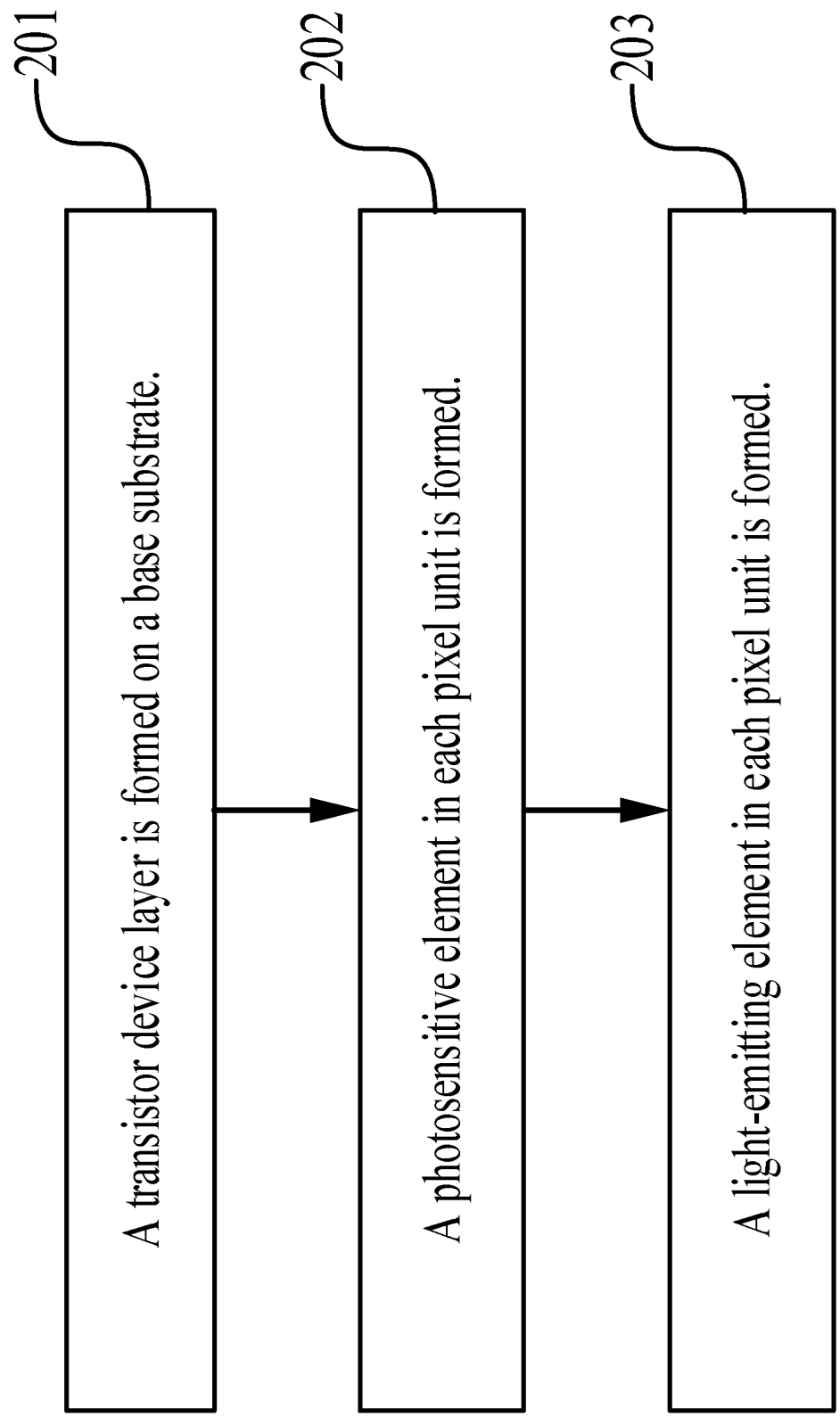
FIG. 11 is a schematic flowchart of a manufacturing method of a display device in accordance with an embodiment of the present disclosure.

FIG. 11 is a schematic process diagram of a manufacturing method of a display device according to one embodiment of the present disclosure. The display device may be any of the above-mentioned display devices. Referring to FIG. 11, the manufacturing method includes the following steps.

In step 201, a transistor device layer is formed on a base substrate.

A switch circuit in each pixel unit and a light-emitting driving sub-circuit in a light-emitting circuit are in the transistor device layer. The base substrate may be a glass substrate.

In step 202, a photosensitive element in each pixel unit is formed.

The photosensitive element is formed on the side, distal from the base substrate, of the transistor device layer. In each pixel unit, a sensing output terminal of the photosensitive element is connected to the switch circuit in the transistor device layer. Besides, a sensing output terminal of the photosensitive element may be disposed at the bottom of the photosensitive element, namely, on the side, proximal to the transistor device layer, of the photosensitive element.

In step 203, a light-emitting element in each pixel unit is formed.

The light-emitting element is formed on the side, distal from the base substrate, of the photosensitive element. In each pixel unit, one electrode of the light-emitting element is connected to a light-emitting current output terminal of the light-emitting driving sub-circuit. For example, an electrode disposed at the bottom of the light-emitting element is connected to the light-emitting current output terminal.

Using a display device that includes a plurality of pixel unit as shown in FIG. 5 and FIG. 6 as an example, the manufacturing method may specifically include the following processes.

Manufacture of a light-shielding layer and a buffer layer: a pattern that includes the light-shielding layer is formed on a glass substrate by a patterning process of a metal material after the glass substrate is cleaned and dried; the light shielding layer is disposed in a corresponding region of an active region of each transistor and is configured to prevent ambient light from irradiating the inside of the active region of the transistor to adversely affect the device characteristics; the metal material may be Ag, Cu, Al or Mo and may also be, for example, an alloy material of AlNd or MoNb; alternatively, the light-shielding layer may adopt, for example, a multi-layer metal structure of Mo/Cu/Mo; after that, the buffer layer (Buffer) that covers the light-shielding layer and the glass substrate is made from an insulating material; and it should be noted that the glass substrate, the light-shielding layer or the buffer layer is not shown in FIG. 5 or FIG. 6.

Figure 12:
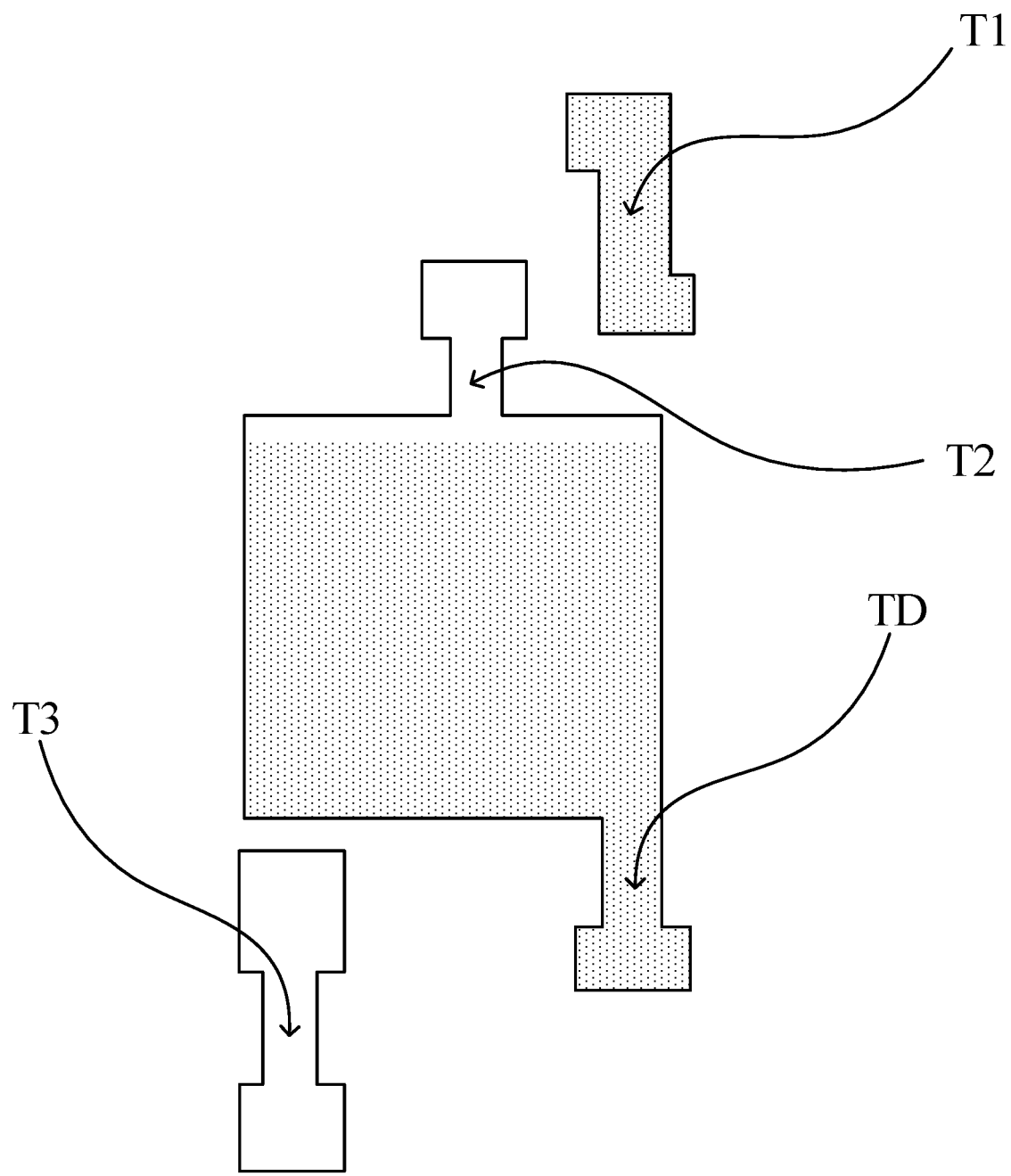
FIGS. 12 to 18 are schematic structural diagrams of each pixel unit of a display device in a manufacturing process in accordance with an embodiment of the present disclosure.

Manufacture of an active layer ACT: a pattern that includes the active layer ACT is formed by a patterning process of a semiconductor material; the semiconductor material may include, for example, at least one of a-IGZO, ZnO:N, IZTO, a-Si, p-Si, alpha-sexithiophene and polythiophene; a technique used for manufacturing the active layer ACT may include such a semiconductor manufacturing technique as an oxide semiconductor technique or a low-temperature polysilicon technique and may be not limited thereto; the formed active layer ACT may be as shown in FIG. 12 for example; it may be seen from FIG. 12 that the active layer ACT may include a driving transistor TD, as well as an active region of each of a first transistor T1, a second transistor T2 and a third transistor T2; and it should be understood that the foregoing process may include a process of manufacturing a conductive channel in the active region of each transistor and/or a process of performing conduction treatment on the semiconductor material at the joint of a source or a drain and the active region.

Figure 13:
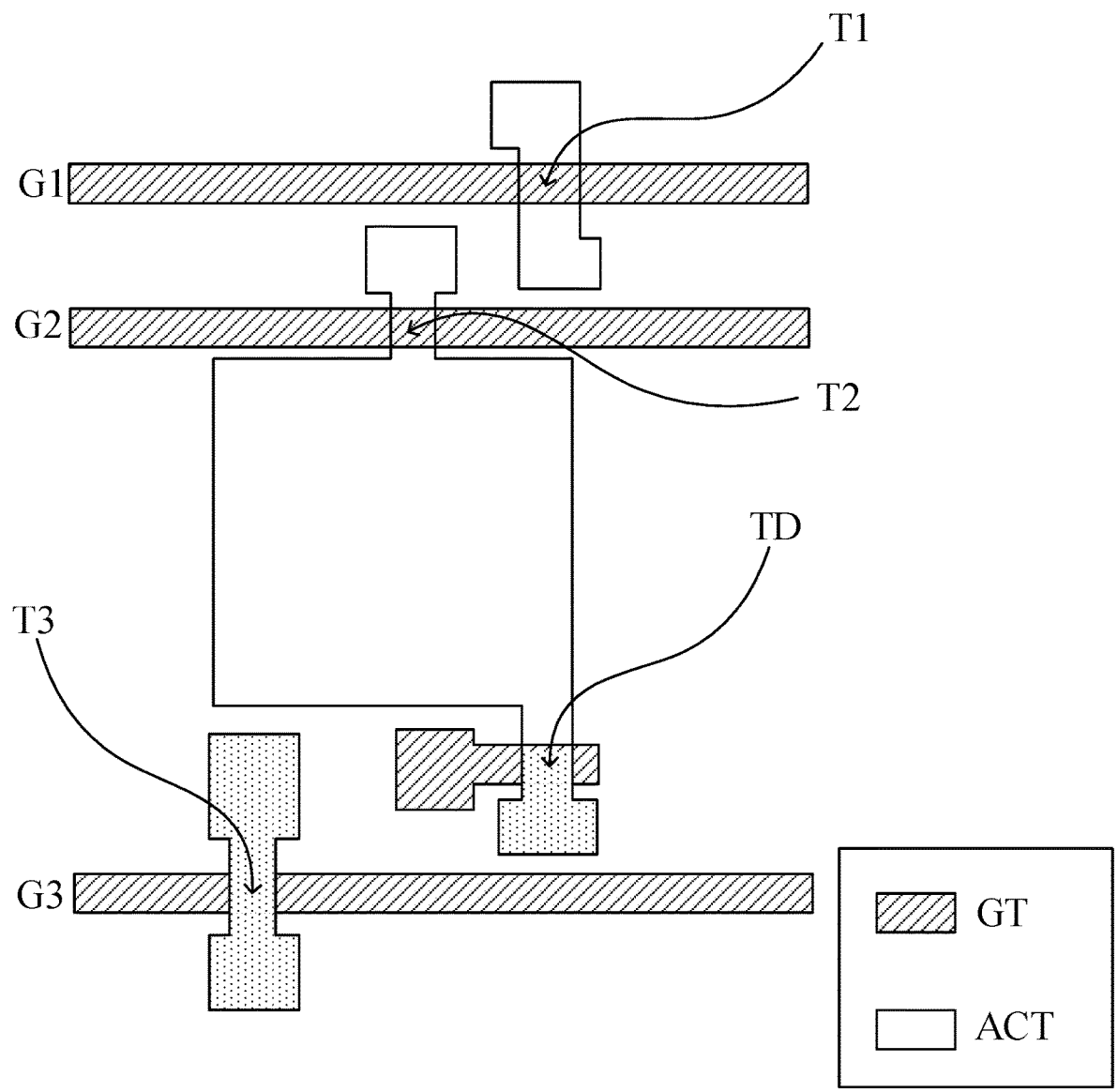

Manufacture of a gate insulating layer GI and a gate conductive layer GT: material film layers of the gate insulating layer GI and the gate conductive layer GT may be deposited sequentially and then patterned to form a pattern that includes the gate of each transistor, a first switch signal line G1, a second switch signal line G2 and a gate line G3 as shown in FIG. 13; the material film layer of the gate conductive layer GT may be made of a metal material, which may be Ag, Cu, Al and Mo and may also be an alloy material of AiNd and MoNb for example; alternatively, the material film layer of the gate conductive layer GT may adopt, for example, a multi-layer metal structure of Mo/Cu/Mo; in one example, the gate insulating layer GI and the gate conductive layer GT may be formed by a self-aligned process; in one example, the foregoing process of performing conduction treatment on the semiconductor material in the active layer ACT may be performed after formation of the gate conductive layer GT; for example, the patterned gate insulating layer GI and gate conductive layer GT may be taken as masks, and conduction treatment is performed on the exposed active layer ACT by a plasma process (for example, a plasma process used in a dry etching process); and the conducted portion in the active layer ACT may serve as a signal line or a polar plate of a capacitor.

Figure 14:
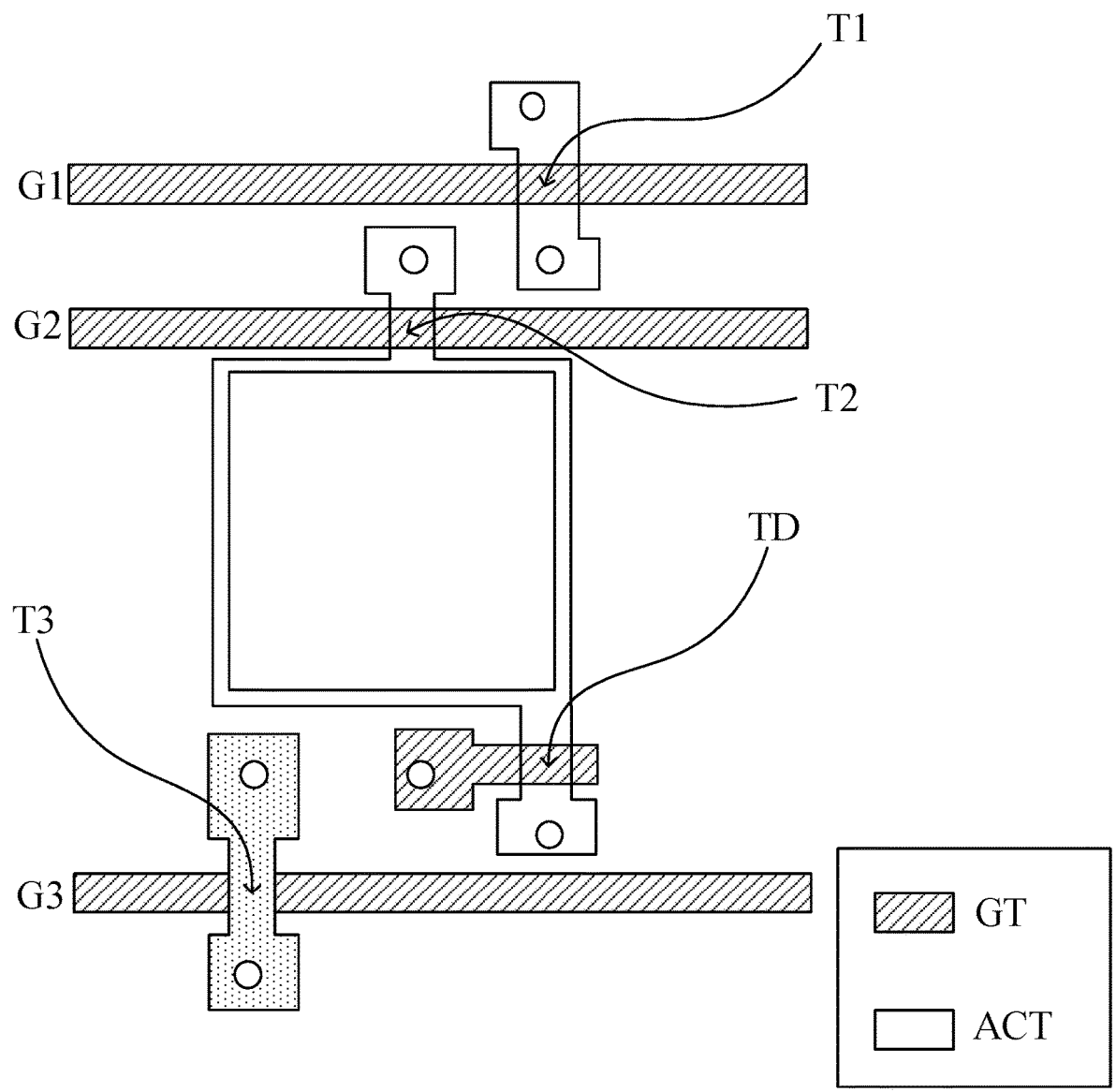
Figure 15:
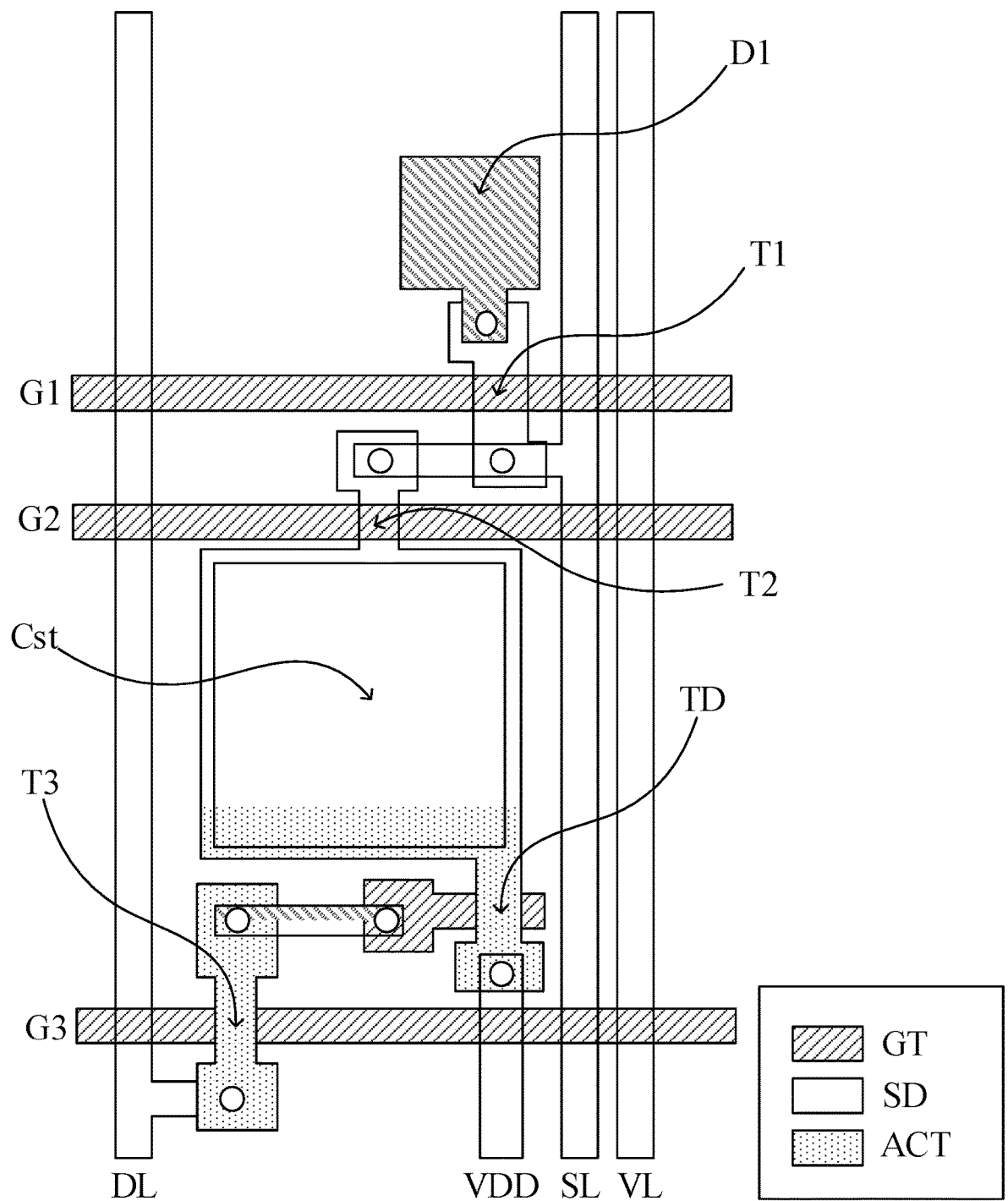

Manufacture of an interlayer dielectric layer ILD and a by hole therein: an insulating layer material that covers the buffer layer, the active layer ACT and the gate conductive layer GT may be deposited to serve as the interlayer dielectric layer ILD; and then, a source connection by hole and a drain connection by hole as shown in FIG. 14, as well as a connection by hole between the source of the third transistor T3 and the gate of the driving transistor TD, are etched in the interlayer dielectric layer ILD by a patterning process.

Manufacture of a source/drain conductive layer SD: a pattern that includes the source and the drain of each transistor, a lower polar plate of a storage capacitor Cst, a second electrode of a photosensitive element D1, a data line DL, a sensing signal line SL, a bias voltage line VL and a voltage line for providing a light-emitting power supply positive terminal VDD may be formed by a patterning process of a metal material; the metal material may be Ag, Cu, Al and Mo and may also be, for example, an alloy material of AlNd and MoNb; or the source/drain conductive layer SD may adopt, for example, a multi-layer metal structure of Mo/Cu/Mo.

Figure 16:
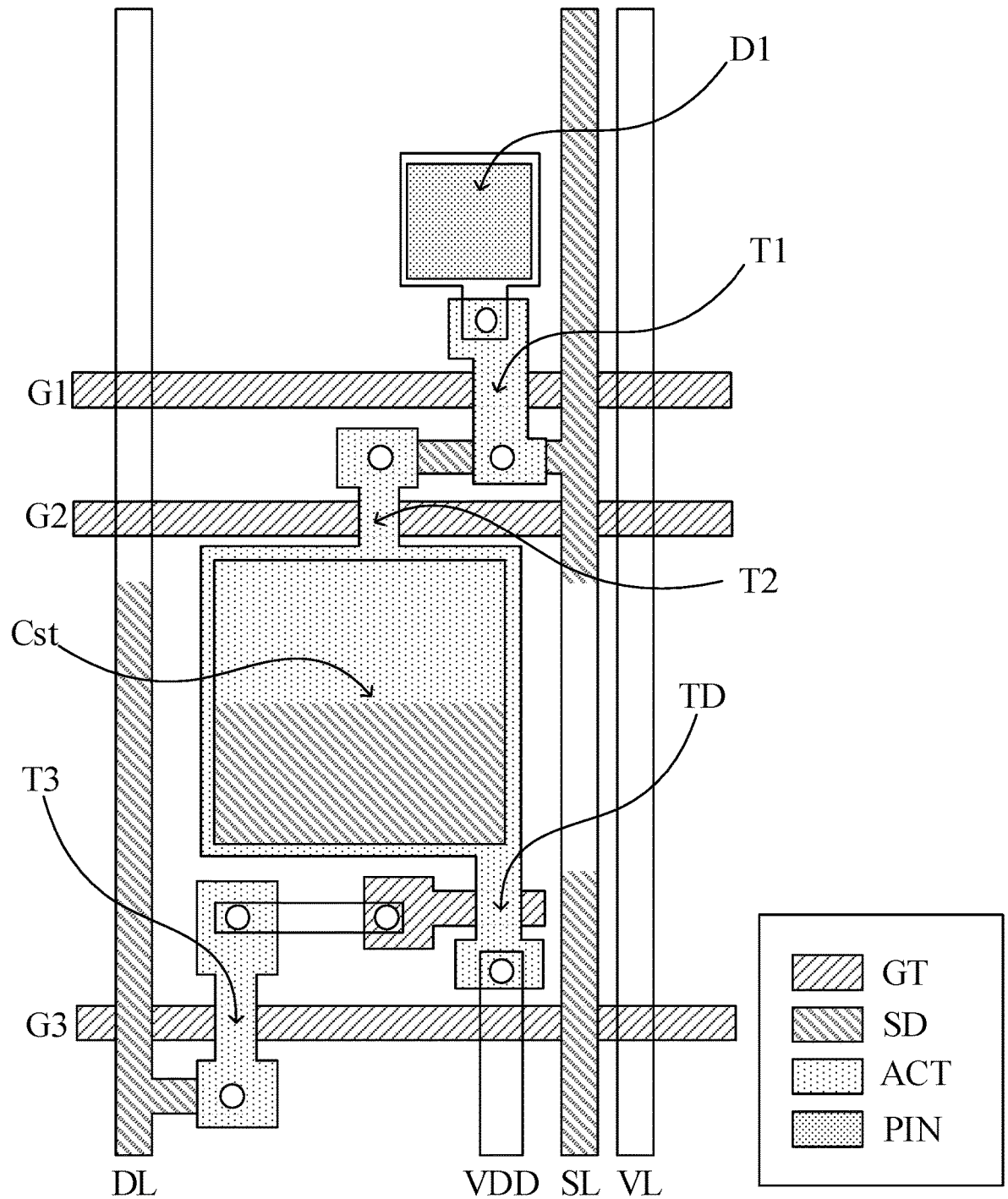

Manufacture of a photosensitive material layer PIN: a pattern that includes a first passivation layer PV1 may be formed by a pattering process of an insulating material; the first passivation layer PV1 includes a connection by hole between the photosensitive material layer PIN and a second electrode; the first passivation layer PV1 may be of a double-layered structure; the layer (namely, a lower layer) proximal to the base substrate may be made from a SiOx material; the layer (namely, an upper layer) distal from the base substrate may be made from denser SiNx; after that, an N-type semiconductor material thin film, an I-type semiconductor material thin film and a P-type semiconductor material thin film are sequentially deposited by a plasma enhanced chemical vapor deposition method (PECVD); the photosensitive material layer PIN is formed by patterning to form a pixel unit as shown in FIG. 16; with reference to FIG. 16, it may be seen that the photosensitive material layer PIN is formed in the connection by hole in the first passivation layer PV1; and in one example, an I-type semiconductor material is an intrinsic semiconductor material, an N-type semiconductor material is a phosphorus/arsenic-doped semiconductor material, and a P-type semiconductor material is a boron-doped semiconductor material.

Figure 17:
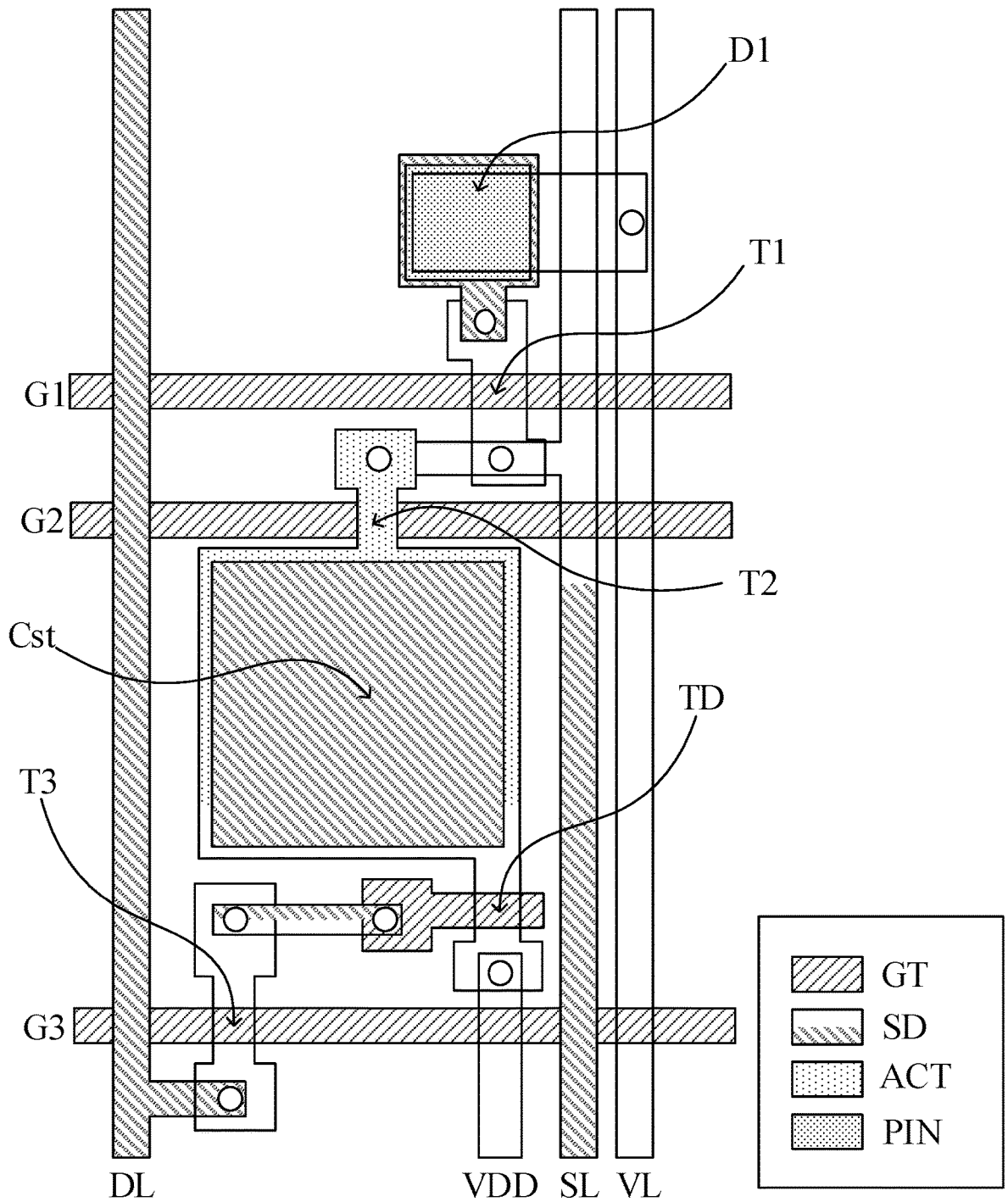

After that, a pattern that includes a second passivation layer PV2 may be formed by a patterning process of an insulating material. The second passivation layer PV2 includes a connection by hole between a photosensitive material layer PIN and a first electrode and a connection by hole between the first electrode and the bias voltage line VL. The formed pixel unit is as shown in FIG. 17.

By taking the connection mode between the first electrode and the gate of the driving transistor TD as an example, a connection by hole between the upper polar plate of the storage capacitor Cst and the gate of the driving transistor TD may be simultaneously formed in the second passivation layer PV2, the first passivation layer PV1 and the interlayer dielectric layer ILD. In another implementation, insulating material thin films of the first passivation layer PV1 and the second passivation layer PV2 may be sequentially deposited first. Then, all by holes in the first passivation layer PV1 and the second passivation layer PV2 may be etched by the patterning process. Afterwards, the N-type semiconductor material thin film, the I-type semiconductor material thin film and the P-type semiconductor material thin film are sequentially deposited. The photosensitive material layer PIN is formed by patterning. Thus, one time of a mask process may be omitted in the manufacturing process.

Figure 18:
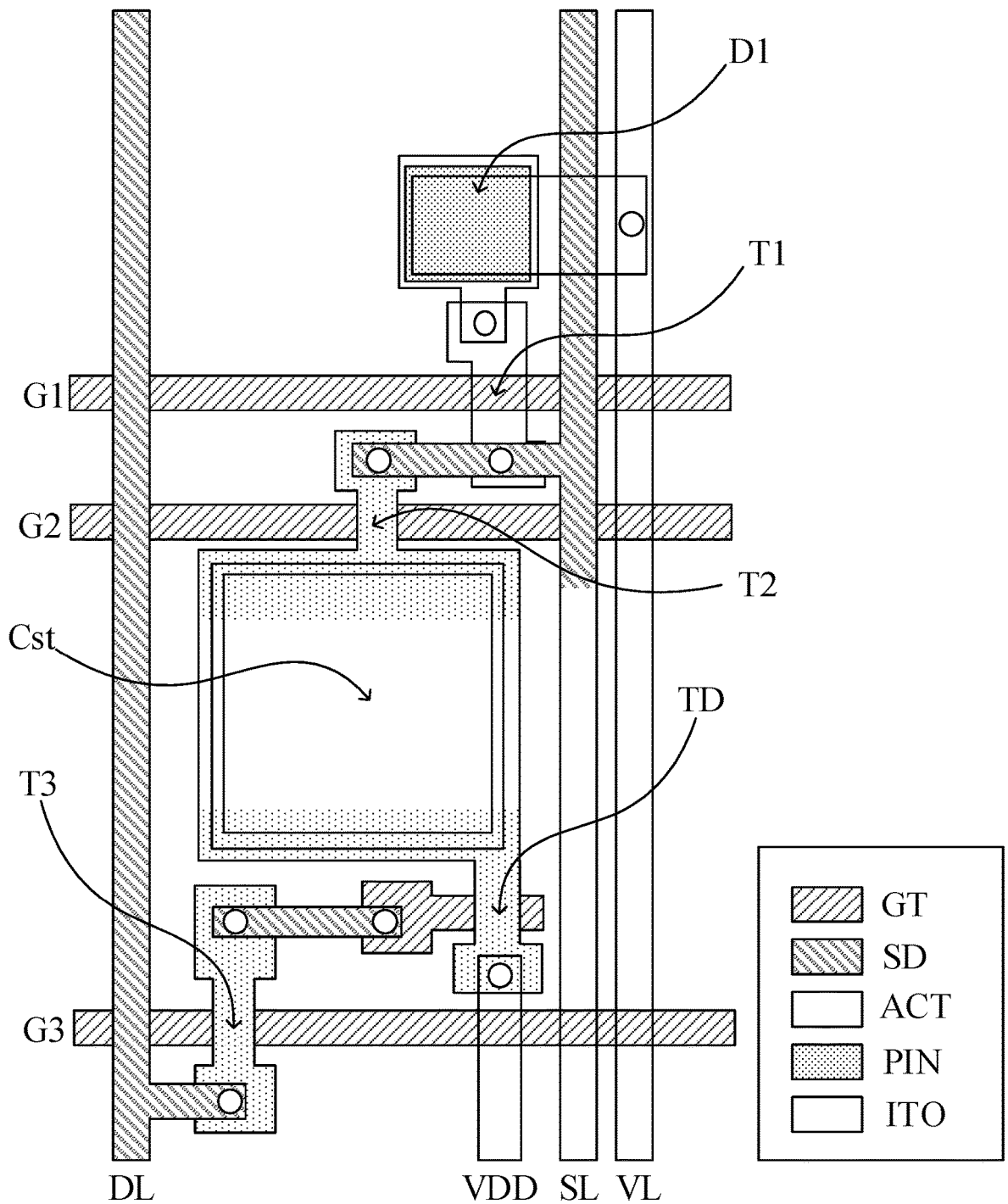

Manufacture of a transparent conductive layer ITO: a pattern that includes a first electrode of the photosensitive element D1 and an upper polar plate of the storage capacitor Cst is formed by a patterning process of a transparent conductive material; the formed pixel unit is as shown in FIG. 18; the formed first electrode is in lap joint with an upper surface of the photosensitive material layer PIUN and is connected to the bias voltage line VL in the source/drain conductive layer SD by a by hole; the transparent conductive material may include a transparent conductive oxide (such as indium tin oxide or Al-doped ZnO) or other conductive transparent materials.

Manufacture of a color filter layer CF: red, green and blue color filter layers CF are sequentially manufactured in the pixel units in different colors and types; the color filter layer in each pixel unit completely covers the photosensitive element D1; and referring to the manufacture process of a color filter in the related art for formation of the color filter layer CF, which is not repeated herein.

Manufacture of a planarization layer OC, an anode conductive layer E1 and a pixel defining layer PDL: a pattern that includes the planarization layer OC may be formed by a patterning process of an organic insulating material; the planarization layer OC includes a connection by hole (not shown in any figure) between an anode of the light-emitting element D2 and the source of the driving transistor TD; the organic insulating material may include a polysiloxane material, an acrylic material or a polyimide material; then, a pattern that includes the anode of each light-emitting element D2 is formed by a patterning process of a transparent conductive material; the anode of the light-emitting element D2 in the anode conductive layer E1 in each pixel unit may be connected to the source of the driving transistor TD by the connection by hole in the planarization layer OC; and based on this, a pattern that includes the pixel defining layer PDL may be formed by a patterning process of a light-shielding material (for example, a black material with very high light absorptivity) to define a light-emitting region (namely, the above-mentioned second region) in each pixel unit.

Manufacture of a light-emitting element D2: the organic light-emitting layer EL and the cathode conductive layer E2 may be sequentially formed with reference to the manufacturing method of any white-light OLED in the related art; the cathode conductive layer E2 may adopt a single-layer metal structure formed by a metal material (which may be Ag, Cu, Al, Mo or alloy materials of ANd, MoNb, etc.), may also adopt a multi-layer metal structure formed by Mo/Cu/Mo for example, and may further adopt a stacked structure (such as Mo/AiNd/ndium tin oxide) formed by metals and transparent conductive oxides (such as indium tin oxide and Al-doped ZnO).

After manufacture of the light-emitting element D2 is accomplished, such steps as manufacture of a packaging structure may further be included and will not be repeated herein.

By taking this as an example, referring to the foregoing examples for the structure of any of the above-mentioned pixel units other than this to realize a manufacturing method of the corresponding display device, which is not repeated herein.

It may be seen that based on the structure of the pixel unit disclosed by the present disclosure, a sensed signal (namely, the sensed light intensity signal) relevant to the change of the self-illuminating efficiency of the light-emitting element may be acquired when the sensing output terminal and the sensing signal line are electrically connected. Based on this, compensation for the change of the self-illuminating efficiency of the light-emitting element may be realized with reference to external calculation and adjustment of a data signal, which helps to improve the luminance uniformity and to prolong the service life of the self-luminous display device.

Described above are merely exemplary embodiments of the present disclosure, and are not intended to limit the present disclosure. Within the spirit and principles of the disclosure, any modifications, equivalent substitutions, or improvements, are within the protection scope of the present disclosure.

What is claimed is:

1. A pixel unit, comprising a light-emitting circuit, a photosensitive element and a switch circuit; wherein
    the light-emitting circuit is configured to emit light under control of light-emitting control data provided by an external control circuit;
    a sensing output terminal of the photosensitive element is connected to the switch circuit, and the photosensitive element is configured to sense a light intensity of the light emitted by the light-emitting circuit and to output a sensed light intensity signal by the sensing output terminal; and
    the switch circuit is configured to be connected to the external control circuit and to control an ON/OFF state between the sensing output terminal and the external control circuit based on a received switch control signal, and the external control circuit is configured to adjust the light-emitting control data based on the sensed light intensity signal;
    wherein the photosensitive element comprises a first electrode, a photosensitive material layer and a second electrode which are sequentially stacked in a direction distal from a light-emitting element in the light-emitting circuit;
    wherein the first electrode is made from a transparent conductive material and is connected to a bias signal terminal that is configured to provide a bias voltage, and the second electrode is made from a light-shielding material and is connected to the switch circuit as the sensing output terminal of the photosensitive element;
    the light-emitting circuit comprises a light-emitting element and a light-emitting driving sub-circuit, wherein a light-emitting current output terminal of the light-emitting driving sub-circuit is connected to one electrode of the light-emitting element;
    the switch circuit is further connected to the light-emitting current output terminal and further configured to: control an ON/OFF state between the light-emitting current output terminal and the external control circuit based on the received switch control signal, such that the external control circuit adjusts luminance of the light-emitting element based on data output by the light-emitting current output terminal, wherein the switch control signal comprises a first switch signal and a second switch signal; and
    the switch circuit is configured to control the ON/OFF state between the sensing output terminal and the external control circuit based on the first switch signal and to control the ON/OFF state between the light-emitting current output terminal and the external control circuit based on the second switch signal.

2. The pixel unit according to claim 1, wherein the switch circuit comprises a first transistor and a second transistor;
    a gate of the first transistor is configured to be connected to a first switch signal terminal, one of a source and a drain of the first transistor is configured to be connected to the external control circuit, and the other thereof is connected to the light-emitting current output terminal;
    a gate of the second transistor is configured to be connected to a second switch signal terminal, one of a source and a drain of the second transistor is configured to be connected to the external control circuit, and the other thereof is connected to the sensing output terminal; and
    the first switch signal terminal is configured to provide the first switch signal, and the second switch signal terminal is configured to provide the second switch signal.

3. The pixel unit according to claim 2, wherein a gate of a transistor comprised by the switch circuit is connected to a switch signal terminal by a switch signal line, and the switch signal line is in a gate conductive layer where the gate of the transistor comprised by the switch circuit is disposed.

4. The pixel unit according to claim 2, wherein a gate of a transistor comprised in the switch circuit is connected to a switch signal terminal by a switch signal line, wherein the switch signal line is disposed a gate conductive layer where the gate of the transistor comprised in the switch circuit is disposed;
    the photosensitive element comprises the first electrode, the photosensitive material layer and the second electrode which are sequentially stacked in the direction distal from the light-emitting element in the light-emitting circuit, wherein the first electrode is made from the transparent conductive material and is connected to the bias signal terminal that is configured to provide the bias voltage, and the second electrode is made from the light-shielding material and is connected to the switch circuit as the sensing output terminal of the photosensitive element, and the photosensitive material layer comprises a P-type semiconductor material layer, an I-type semiconductor material layer and an N-type semiconductor material layer which are sequentially stacked in the direction distal from the light-emitting element;
    the switch circuit is connected to the external control circuit by a sensing signal line, wherein the second electrode and the sensing signal line are both disposed in a source/drain conductive layer where a source and a drain of the transistor comprised in the switch circuit are disposed; and the first electrode is connected to the bias signal terminal by a bias voltage line, wherein the bias voltage line is arranged in the same layer as the sensing signal line for connecting the switch circuit to the external control circuit and extends in the same direction;
    the light-emitting driving sub-circuit comprises a third transistor, a storage capacitor and a driving transistor, wherein a gate of the third transistor is connected to a gate line, one of a source and a drain of the third transistor is connected to a data line and the other thereof is connected to a gate of the driving transistor, one of a source and a drain of the driving transistor is connected to the light-emitting current output terminal and the other thereof is connected to a light-emitting power supply terminal, and a first terminal of the storage capacitor is connected to the gate of the driving transistor and a second terminal of the storage capacitor is connected to the light-emitting current output terminal;
    the pixel unit further comprises a color filter layer and a pixel defining layer, wherein the color filter layer is disposed on one side of a light-emitting element in the light-emitting circuit, and the photosensitive element is disposed on the side, distal from the light-emitting element, of the color filter layer and is made from the light-shielding material;
    the pixel unit further comprises a first region where the pixel defining layer is disposed and a second region surrounded by the first region, wherein the switch circuit is disposed in the first region, the light-emitting element in the light-emitting circuit is disposed in the second region, the photosensitive element is disposed at an edge, proximal to the switch circuit, in the second region, and the light-emitting driving sub-circuit in the light-emitting circuit is disposed in the first region and is disposed on a side, distal from the second region, of the switch circuit.

5. The pixel unit according to claim 1, further comprising a pixel defining layer made from a light-shielding material, wherein the pixel unit is provided with a first region where the pixel defining layer is disposed and a second region surrounded by the first region;

the switch circuit is in the first region; a light-emitting element in the light-emitting circuit is in the second region; and the photosensitive element is disposed at an edge, proximal to the switch circuit, in the second region.

6. The pixel unit according to claim 5, wherein a light-emitting driving sub-circuit in the light-emitting circuit is in the first region and disposed on the side, distal from the second region, of the switch circuit.

7. A compensation method of the pixel unit according to claim 1, applied to an external control circuit, comprising:
receiving a sensed light intensity signal sent by the switch circuit, wherein the sensed light intensity signal is obtained by sensing, by the photosensitive element, the light intensity of light emitted by the light-emitting circuit;
determining a target compensation quantity of light-emitting control data based on the sensed light intensity signal;
compensating for the light-emitting control data of the pixel unit based on the target compensation quantity; and
driving, based on the compensated light-emitting control data, the light-emitting circuit to emit light.

8. The compensation method according to claim 7, wherein the determining a target compensation quantity of light-emitting control data based on the sensed light intensity signal comprises:
determining, based on the sensed light intensity signal, an actual light intensity of the light emitted by the light-emitting circuit;
acquiring actual light-emitting control data for driving the light-emitting circuit when the photosensitive element senses the light emitted by the light-emitting circuit; and
determining, based on a corresponding relationship among light intensity, light-emitting control data and compensation quantity, the target compensation quantity that corresponds to the actual light intensity and the actual light-emitting control data.

9. A display device, comprising at least one pixel unit as defined in claim 1.

10. The display device according to claim 9, further comprising an external control circuit connected to a light-emitting circuit and a switch circuit in the pixel unit.

11. The pixel unit according to claim 1, wherein the switch circuit is connected to the external control circuit by a sensing signal line, wherein the second electrode and the sensing signal line are both disposed in a source/drain conductive layer where a source and a drain of a transistor comprised in the switch circuit are disposed.

12. The pixel unit according to claim 1, wherein the first electrode is connected to the bias signal terminal by a bias voltage line, wherein the bias voltage line and the sensing signal line for connecting the switch circuit to the external control circuit are disposed on the same layer and extend in the same direction.

13. The pixel unit according to claim 1, wherein the switch circuit comprises a first transistor;
wherein a gate of the first transistor is configured to be connected to a switch signal terminal, one of a source and a drain of the first transistor is configured to be connected to the external control circuit, the other thereof is connected to the sensing output terminal, and the switch signal terminal is configured to provide the switch control signal.

14. The pixel unit according to claim 1, wherein the switch circuit comprises a first transistor and a second transistor which are respectively one of an N-type transistor and a P-type transistor;
a gate of the first transistor is configured to be connected to a switch signal terminal, one of a source and a drain of the first transistor is configured to be connected to the external control circuit, and the other thereof is connected to the sensing output terminal;
a gate of the second transistor is configured to be connected to the switch signal terminal, one of a source and a drain of the second transistor is configured to be connected to the external control circuit, and the other thereof is connected to the light-emitting current output terminal; and
the switch signal terminal is configured to provide the switch control signal.

15. The pixel unit according to claim 1, wherein the light-emitting driving sub-circuit comprises a third transistor, a storage capacitor and a driving transistor;
a gate of the third transistor is connected to a gate line, one of a source and a drain of the third transistor is connected to a data line, and the other thereof is connected to a gate of the driving transistor;
one of a source and a drain of the driving transistor is connected to the light-emitting current output terminal, and the other thereof is connected to a light-emitting power supply terminal; and
a first terminal of the storage capacitor is connected to the gate of the driving transistor, and a second terminal of the storage capacitor is connected to the light-emitting power supply terminal.

16. The pixel unit according to claim 1, further comprising a color filter layer disposed on one side of a light-emitting element in the light-emitting circuit, and the photosensitive element is disposed on the side, distal from the light-emitting element, of the color filter layer.

17. The pixel unit according to claim 1, wherein the photosensitive material layer comprises a P-type semiconductor material layer, an I-type semiconductor material layer and an N-type semiconductor material layer which are sequentially stacked in the direction distal from the light-emitting element.

18. A manufacturing method of a display device, comprising:
forming a transistor device layer on a base substrate, wherein the transistor device layer comprises a switch circuit of each pixel unit and a light-emitting driving sub-circuit in a light-emitting circuit;
forming a photosensitive element of each pixel unit, wherein a sensing output terminal of the photosensitive element is connected to the switch circuit in the transistor device layer; and
forming a light-emitting element in the light-emitting circuit of each pixel unit, wherein one electrode of the light-emitting element is connected to a light-emitting current output terminal of the light-emitting driving sub-circuit;

wherein the switch circuit is further configured to be connected to an external control circuit and to control an ON/OFF state between a sensing output terminal and the external control circuit based on a received switch control signal, wherein the external control circuit is configured to adjust light-emitting control data based a sensed light intensity signal;

the switch circuit is further connected to the light-emitting current output terminal and further configured to: control an ON/OFF state between the light-emitting current output terminal and the external control circuit based on the received switch control signal, such that the external control circuit adjusts luminance of the light-emitting element based on data output by the light-emitting current output terminal, wherein the switch control signal comprises a first switch signal and a second switch signal; and the switch circuit is configured to control the ON/OFF state between the sensing output terminal and the external control circuit based on the first switch signal and to control the ON/OFF state between the light-emitting current output terminal and the external control circuit based on the second switch signal.

* * * * *